US012175034B2

(12) United States Patent
Kishimoto et al.

(10) Patent No.: US 12,175,034 B2
(45) Date of Patent: *Dec. 24, 2024

(54) DIGITIZER AND DISPLAY DEVICE INCLUDING THE SAME

(71) Applicant: Samsung Display Co., LTD., Yongin-si (KR)

(72) Inventors: Hirotsugu Kishimoto, Yongin-si (KR); Yong Kwan Kim, Yongin-si (KR); Hyun Jae Na, Yongin-si (KR); Seok Won Jang, Yongin-si (KR); Sung Guk An, Yongin-si (KR); Chul Ho Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/364,292

(22) Filed: Aug. 2, 2023

(65) Prior Publication Data
US 2024/0143097 A1    May 2, 2024

(30) Foreign Application Priority Data

Oct. 31, 2022    (KR) .......................... 10-2022-0142022

(51) Int. Cl.
*G09G 3/04*    (2006.01)
*G06F 3/041*    (2006.01)
(Continued)

(52) U.S. Cl.
CPC .......... *G06F 3/0412* (2013.01); *G06F 3/0446* (2019.05); *H10K 59/40* (2023.02);
(Continued)

(58) Field of Classification Search
CPC ................. G06F 3/0412; G06F 3/0446; G06F 2203/04102; G06F 2203/04111; H10K 59/40; H10K 2102/311; H10K 59/12
See application file for complete search history.

(56) References Cited

U.S. PATENT DOCUMENTS 9,639,121 B2 *   5/2017   Min ........................ H05K 1/038
2014/0367150 A1 *  12/2014   Inoue ...................... B32B 15/14
428/221

(Continued)

FOREIGN PATENT DOCUMENTS

JP    2008-133329    6/2008
JP    2012-126104    7/2012
(Continued)

*Primary Examiner* — Kenneth Bukowski
(74) *Attorney, Agent, or Firm* — KILE PARK REED & HOUTTEMAN PLLC

(57) ABSTRACT

A display device includes a display panel including a first non-folding area, a second non-folding area, and a folding area that are arranged along a first direction, the folding area being foldable along a folding line extending along a second direction intersecting the first direction, a panel lower member disposed below the display panel, and a digitizer disposed below the panel lower member and including a base layer and sensing coils. The base layer includes a folding portion including holes overlapping the folding area of the display panel and first and second non-folding portions disposed along the first direction. The folding portion is disposed between the first and second non-folding portions. The sensing coils are disposed on the base layer, and the base layer includes a matrix including a filler and an elastomer and weaving-shaped fiber lines disposed inside the matrix and alternately arranged with each other.

20 Claims, 20 Drawing Sheets

(51) Int. Cl.
    *G06F 3/044*           (2006.01)
    *H10K 59/40*           (2023.01)
    *H10K 59/12*            (2023.01)
    *H10K 102/00*         (2023.01)

(52) U.S. Cl.
    CPC .............. *G06F 2203/04102* (2013.01); *G06F 2203/04111* (2013.01); *H10K 59/12* (2023.02); *H10K 2102/311* (2023.02)

(56) References Cited

U.S. PATENT DOCUMENTS

| | | | |
|---|---|---|---|
| 2016/0143135 A1* | 5/2016 | Inoue | C08L 63/00 |
| | | | 523/466 |
| 2018/0275031 A1* | 9/2018 | Kashihara | B32B 37/1018 |
| 2023/0236629 A1* | 7/2023 | Kishimoto | G06F 1/1652 |
| | | | 361/679.02 |
| 2023/0289021 A1* | 9/2023 | Jeon | G06F 3/046 |
| 2024/0083137 A1* | 3/2024 | Qin | B32B 27/32 |

FOREIGN PATENT DOCUMENTS

| | | |
|---|---|---|
| JP | 2014-70156 | 4/2014 |
| JP | 2015-44969 | 3/2015 |
| JP | 2017-61609 | 3/2017 |
| KR | 10-2023-0113438 | 7/2023 |

\* cited by examiner

DIGITIZER AND DISPLAY DEVICE INCLUDING THE SAME

CROSS-REFERENCE TO RELATED APPLICATION(S)

This application claims priority to and benefits of Korean Patent Application No. 10-2022-0142022 under 35 U.S.C. § 119, filed on Oct. 31, 2022, in the Korean Intellectual Property Office, the entire contents of which are incorporated herein by reference.

BACKGROUND

1. Technical Field

Embodiments relate to a digitizer and a display device including the digitizer.

2. Description of the Related Art

With the advancement of the information age, the demand for various display devices displaying an image has increased. For example, the display device has been applied to various electronic devices such as a smart phone, a digital camera, a laptop computer, a navigator and a smart television.

Recently, a flexible display device with a wide display screen having improved portability or enhanced space utilization by using a flexible material has been spotlighted. For example, a bendable display device, a rollable display device, a foldable display device, and the like have been developed.

A recent display device supports a touch input by an electronic pen (e.g., stylus pen) together with a touch input by a portion (e.g., finger) of a user's body. The display device may sense a touch input by an electronic pen more precisely than the case that only a touch input by a portion of the user's body is used.

SUMMARY

Embodiments provide a display device including a digitizer that senses an external input and has improved folding characteristics.

However, embodiments of the disclosure are not limited to those set forth herein. The above and other embodiments will become more apparent to one of ordinary skill in the art to which the disclosure pertains by referencing the detailed description of the disclosure given below.

According to an aspect of the disclosure, a display device may include a display panel including a first non-folding area, a second non-folding area, and a folding area that are arranged along a first direction, the folding area being foldable along a folding line extending along a second direction intersecting the first direction, a panel lower member disposed below the display panel, and a digitizer disposed below the panel lower member and including a base layer and sensing coils, wherein the base layer may include a folding portion including holes overlapping the folding area of the display panel, and first and second non-folding portions disposed along the first direction, the folding portion disposed between the first and second non-folding portions, and wherein the sensing coils may be disposed on the base layer, wherein the base layer may include a matrix including a filler and an elastomer, and weaving-shaped fiber lines disposed inside the matrix and alternately arranged with each other.

In an embodiment, a first width of each of the holes in the first direction may be in a range of about 0.1 mm to about 0.5 mm, and a second width of each of the holes in the second direction may be in a range of about 4 mm to about 10 mm.

In an embodiment, a first spaced distance between adjacent holes in the first direction among the holes may be in a range of about 0.1 mm to about 0.3 mm, and a second spaced distance between adjacent holes in the second direction among the holes may be in a range of about 0.1 mm to about 0.5 mm.

In an embodiment, a width of the folding portion in the first direction may be in a range of about 5 mm to about 20 mm.

In an embodiment, a portion of each of different sensing coils may be disposed between adjacent holes among the holes.

In an embodiment, the sensing coils may include, first sensing coils including first long sides extending along the first direction in the first non-folding portion and the second non-folding portion and first short sides extending along the second direction and connected to an end portion of each of the first long sides, and second sensing coils including second long sides insulated from the first sensing coils and extending along the second direction in the first non-folding portion and the second non-folding portion and second short sides extending along the first direction and connected to an end portion of each of the second long sides.

In an embodiment, a spaced distance in the second direction between the first long sides facing each other, among the first long sides of the first sensing coils partially disposed between adjacent holes may be substantially equal to or less than a half of a sum of a width of each of the holes in the first direction and a spaced distance between the adjacent holes in the second direction among the holes.

In an embodiment, each of the holes may include a first group hole and a second group hole that extend in the second direction and spaced apart from each other along the second direction, and wherein the second group hole may be shifted in the second direction by a certain distance from the first group hole.

In an embodiment, the matrix may include at least one of epoxy, polyester, polyamide, polycarbonate, polypropylene, polybutylene or vinyl ester, and wherein the filler may include at least one of silica, barium sulfate, sintered talc, barium titanate, titanium oxide, clay, alumina, mica, boehmite, zinc borate or zinc tin oxide.

In an embodiment, the elastomer may include at least one of butadiene rubber, styrene-butadiene rubber, isoprene rubber, styrene-isoprene rubber, polyester rubber, polybutadiene, hydrogenated polybutadiene, nitrile-butadiene rubber, acryl rubber or silicone rubber.

In an embodiment, the base layer may include a plurality of layers stacked along a thickness direction of the display panel.

In an embodiment, the base layer may include, an intermediate layer on which the sensing coils are disposed, an upper layer disposed on the intermediate layer, and a lower layer disposed below the intermediate layer, and wherein the digitizer may further include a bridge line disposed on at least one of the upper layer or the lower layer, and wherein the bridge line may be connected to the sensing coils by passing through at least one of the upper layer and the lower layer.

In an embodiment, a storage modulus of the base layer may be in a range of about 5 MPa to about 50 MPa.

In an embodiment, the display device may further include insulating layers disposed on front and rear surfaces of the base layer to cover the sensing coils, the insulating layers including openings overlapping the holes.

In an embodiment, the insulating layers may include at least one of a pigment or a dye in a black color.

In an embodiment, a thickness of the digitizer may be in a range of about 30 μm to about 300 μm.

According to an aspect of the disclosure, a digitizer may include a base layer including a folding portion having holes, and first and second non-folding portions spaced apart from each other along a first direction, the folding portion disposed between the first and second non-folding portions, sensing coils disposed on the base layer, and insulating layers disposed on front and rear surfaces of the base layer to cover the sensing coils, the insulating layers including openings corresponding to the holes, wherein a portion of each of the sensing coils that are different from each other may be disposed between adjacent holes among the holes, and wherein the base layer may include a matrix including a filler and an elastomer, and weaving-shaped fiber lines disposed inside the matrix and alternately arranged with each other.

In an embodiment, the sensing coils may include, first sensing coils including first long sides extending along the first direction in the first non-folding portion and the second non-folding portion and first short sides extending along a second direction intersecting the first direction and connected to an end portion of each of the first long sides, and second sensing coils including second long sides insulated from the first sensing coils, extending along the second direction in the first non-folding portion and the second non-folding portion and second short sides extending along the first direction and connected to an end portion of each of the second long sides.

In an embodiment, each of the first sensing coils overlapping the folding portion may include, first pattern layers extending in the second direction and spaced apart from each other by the holes disposed between the first pattern layers, a second pattern layer connecting end portions of the first pattern layers, and third pattern layers connected to other end portions opposite to the end portions of the first pattern layers.

In an embodiment, the elastomer may include at least one of butadiene rubber, styrene-butadiene rubber, isoprene rubber, styrene-isoprene rubber, polyester rubber, polybutadiene, hydrogenated polybutadiene, nitrile-butadiene rubber, acryl rubber or silicone rubber.

The display device according to an embodiment may include a digitizer that performs a function of a protective member and may at the same time perform a function of a sensing member, and may improve folding characteristics of the digitizer, thereby preventing crack of the digitizer from occurring due to an external force in case that the display device is folded. Therefore, a display device with improved reliability may be implemented.

The effects according to the embodiments of the disclosure are not limited to those mentioned above and more various effects are included in the following description of the disclosure.

BRIEF DESCRIPTION OF THE DRAWINGS

The above and other aspects and features of the disclosure will become more apparent by describing embodiments thereof with reference to the attached drawings, in which.

DETAILED DESCRIPTION OF THE EMBODIMENTS

Figure 1:
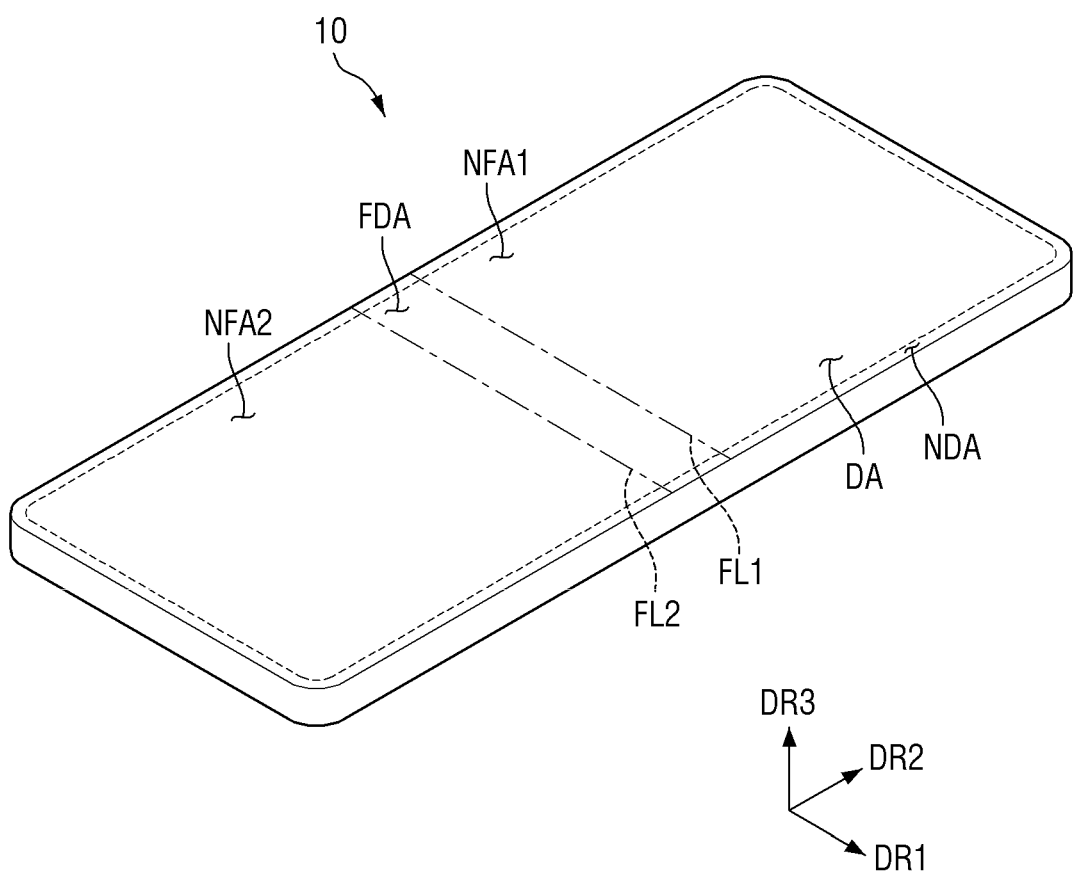
FIG. 1 is a schematic perspective view illustrating an unfolded state of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, specific embodiments will be described with reference to the accompanying drawings.

Figure 2:
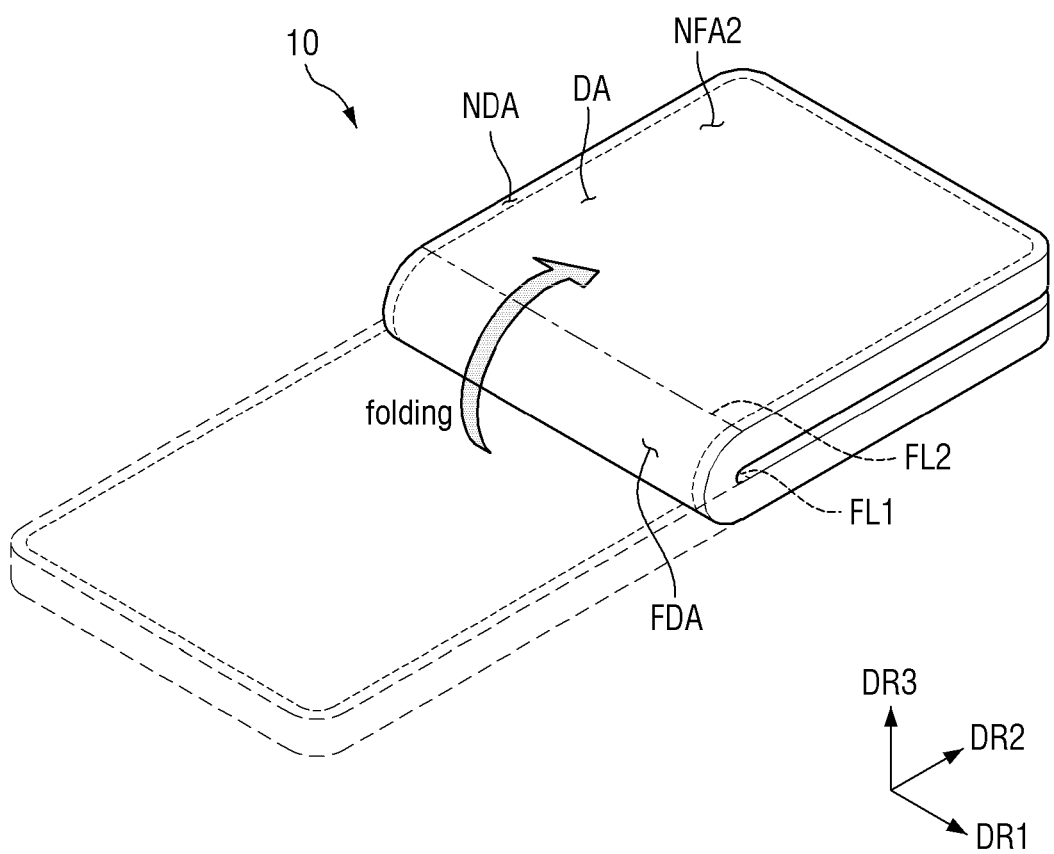
FIG. 2 is a schematic perspective view illustrating a folded state of a display device according to an embodiment.

FIG. 1 is a schematic perspective view illustrating an unfolded state of a display device according to an embodiment. FIG. 2 is a schematic perspective view illustrating a folded state of a display device according to an embodiment.

Referring to FIG. 1, a display device 10 according to an embodiment may be a foldable display device. The display device 10 will be described in case that it is applied to a smart phone, but embodiments are not limited thereto. For example, the display device 10 may be applied to a cellular phone, a tablet PC, a personal digital assistant (PDA), a portable multimedia player (PMP), a television, a game machine, a wristwatch type electronic device, a head mounted display, a monitor of a personal computer, a laptop computer, a vehicle navigator, a vehicle dashboard, a digital camera, a camcorder, an outdoor billboard, an electronic display board, a medical device, an inspection device, various home appliances such as a refrigerator and a washing machine or a device for Internet of Things, in addition to the smart phone. Hereinafter, detailed embodiments will be described with reference to the accompanying drawings.

For example, the display device 10 according to an embodiment may be categorized variously according to a display method. For example, the display device may include an organic light emitting display (OLED) device, an inorganic electroluminescence (EL) display device, a quantum dot light emitting display (QED) device, a micro-LED display device, a nano-LED display device, a field emission display (FED) device, and an electrophoretic display (EPD) device. Hereinafter, the organic light emitting display device will be described as the display device by way of example, and the organic light emitting display device applied to the embodiments will simply be abbreviated as the display device unless required to be specially classified. However, the embodiments are not limited to the organic light emitting display device, and another display device listed as above or known in this art may be applied to the embodiments.

In FIGS. 1 and 2, a first direction DR1 may be a direction parallel with a side of the display device 10 in a plan view, and for example, may be a horizontal direction of the display device 10. A second direction DR2 may be a direction parallel with another side of the display device 10 in a plan view, and may be a vertical direction of the display device 10. A third direction DR3 may be a thickness direction of the display device 10.

The display device 10 may have a rectangular shape or a square shape in a plan view, but embodiments are not limited thereto. In some embodiments, the display device 10 may have a rectangular shape with vertical corners or rounded corners in a plan view. The display device 10 may include two short sides disposed in the first direction DR1 and two long sides disposed in the second direction DR2 in a plan view.

The display device 10 may include a display area DA and a non-display area NDA. The shape of the display area DA may correspond to the shape of the display device 10 in a plan view. For example, in case that the display device 10 has a rectangular shape in a plan view, the display area DA may also have a rectangular shape.

The display area DA may be an area that includes pixels that display an image. The pixels may be arranged in a matrix direction. The pixels may have a rectangular shape, a rhombus shape or a square shape in a plan view, but embodiments are not limited thereto. For example, in a plan view, the pixels may have another quadrangle in addition to the rectangular shape, the rhombus shape or the square shape, another polygonal shape in addition to the quadrangle, a circular shape or an oval shape.

The non-display area NDA may be an area that does not include pixels and thus does not display an image. The non-display area NDA may be disposed in the vicinity (or periphery) of the display area DA. The non-display area NDA may surround the display area DA as shown in FIGS. 1 and 2, but embodiments are not limited thereto. The display area DA may be surrounded (e.g., partially surrounded) by the non-display area NDA.

The display device 10 may include both a folded state and an unfolded state. The display device 10 may be folded in an in-folding manner in which the display area DA is disposed inside as shown in FIG. 2. In case that the display device 10 is folded in an in-folding manner, front surfaces of the display device 10 may face each other. In another example, the display device 10 may be folded in an out-folding manner in which the display area DA is disposed outside. In case that the display device 10 is folded in an out-folding manner, rear surfaces of the display device 10 may face each other.

The display device 10 may include a folding area FDA, a first non-folding area NFA1, and a second non-folding area NFA2. The folding area FDA may be an area in which the display device 10 is bent or folded, and the first non-folding area NFA1 and the second non-folding area NFA2 may be areas in which the display device 10 is neither bent nor folded.

The first non-folding area NFA1 may be disposed at a side of the folding area FDA, for example, an upper side of the folding area FDA. The second non-folding area NFA2 may be disposed at another side of the folding area FDA, for example, a lower side of the folding area FDA. The folding area FDA may be an area defined by a first folding line FL1 and a second folding line FL2 and bent at a certain curvature. The first folding line FL1 may be a boundary between the folding area FDA and the first non-folding area NFA1. The second folding line FL2 may be a boundary between the folding area FDA and the second non-folding area NFA2.

The first folding line FL1 and the second folding line FL2 may extend in the first direction DR1 as shown in FIGS. 1 and 2. For example, the display device 10 may be folded in the second direction DR2. Therefore, since a length of the display device 10 in the second direction DR2 may be reduced to a half, approximately, a user may conveniently carry the display device 10.

In case that the first folding line FL1 and the second folding line FL2 extend in the first direction DR1 as shown in FIGS. 1 and 2, a length of the folding area FDA in the second direction DR2 may be shorter than a length of the folding area FDA in the first direction DR1. A length of the first non-folding area NFA1 in the second direction DR2 may be longer than a length of the first non-folding area NFA1 in the first direction DR1. A length of the second non-folding area NFA2 in the second direction DR2 may be longer than a length of the second non-folding area NFA2 in the first direction DR1.

Each of the display area DA and the non-display area NDA may overlap at least one of the folding area FDA, the first non-folding area NFA1 or the second non-folding area NFA2. In FIGS. 1 and 2, each of the display area DA and the non-display area NDA is illustrated as overlapping the folding area FDA, the first non-folding area NFA1 and the second non-folding area NFA2.

Figure 3:
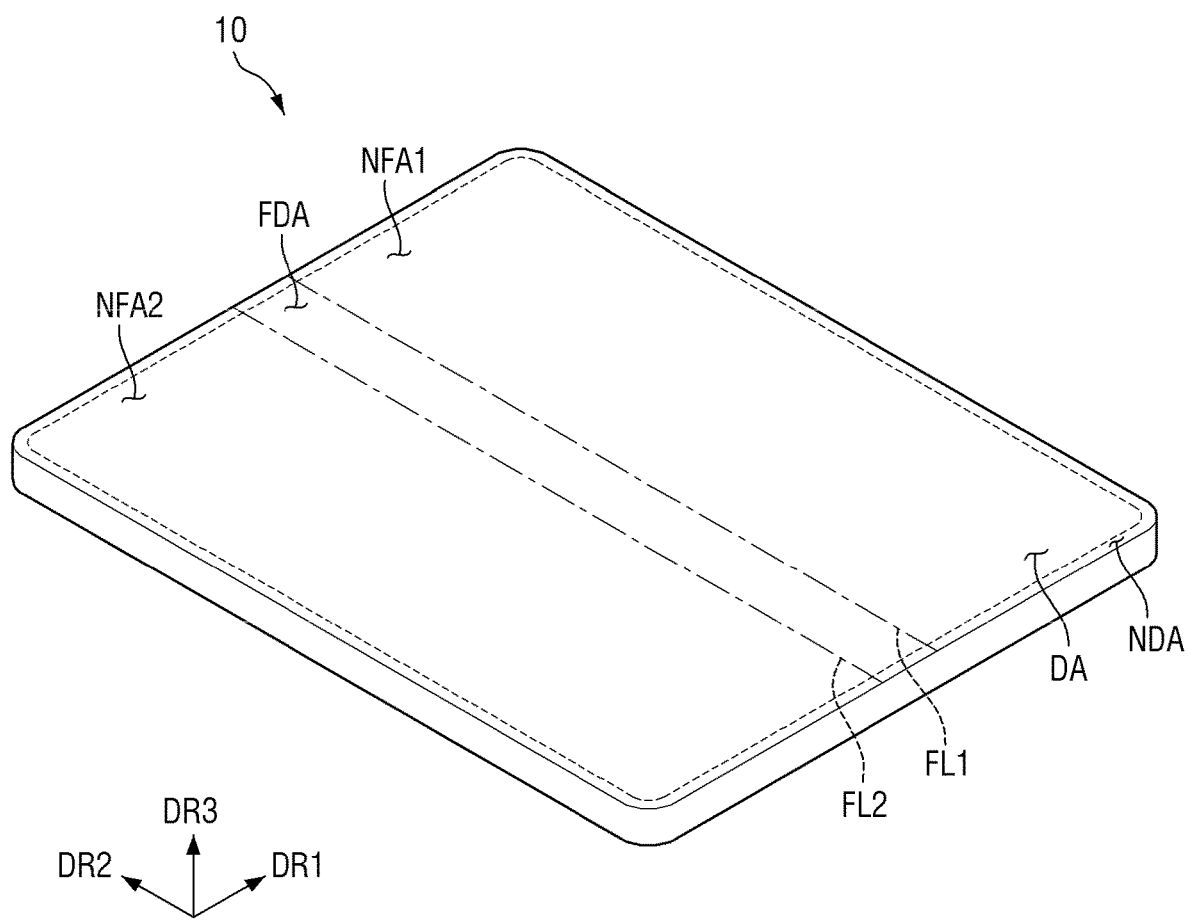
FIG. 3 is a schematic perspective view illustrating an unfolded state of a display device according to an embodiment.
Figure 4:
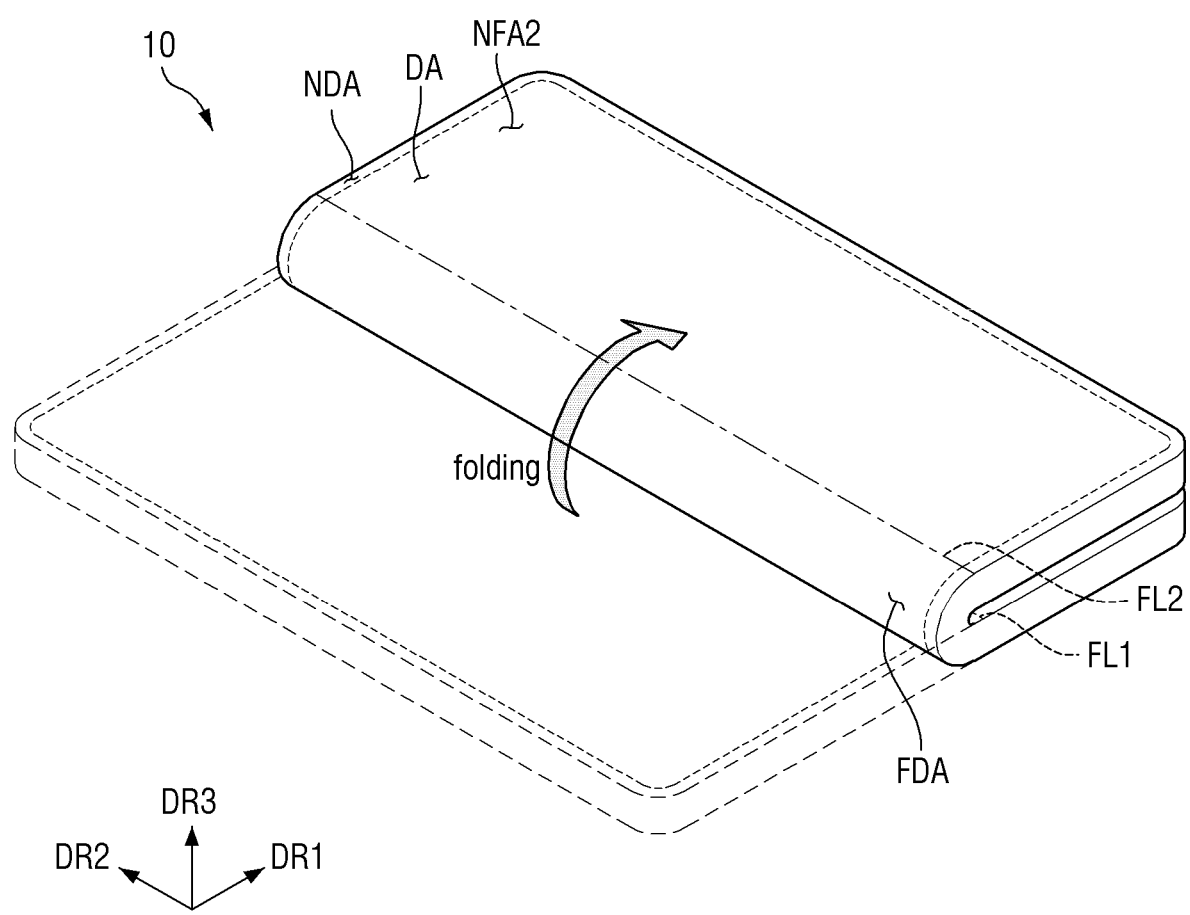
FIG. 4 is a schematic perspective view illustrating a folded state of a display device according to an embodiment.

FIG. 3 is a schematic perspective view illustrating an unfolded state of a display device according to an embodiment. FIG. 4 is a schematic perspective view illustrating a folded state of a display device according to an embodiment.

The embodiment shown in FIGS. 3 and 4 is different from the embodiment of FIGS. 1 and 2 in that the first folding line FL1 and the second folding line FL2 extend in the second direction DR2 and the display device 10 is folded in the first direction DR1. Thus, the length of the display device 10 in the first direction DR1 may be reduced to a half, approximately, such that the display device 10 may be conveniently carried by the user. Therefore, the redundant description of the embodiment of FIGS. 3 and 4 will be omitted for descriptive convenience.

Figure 5:
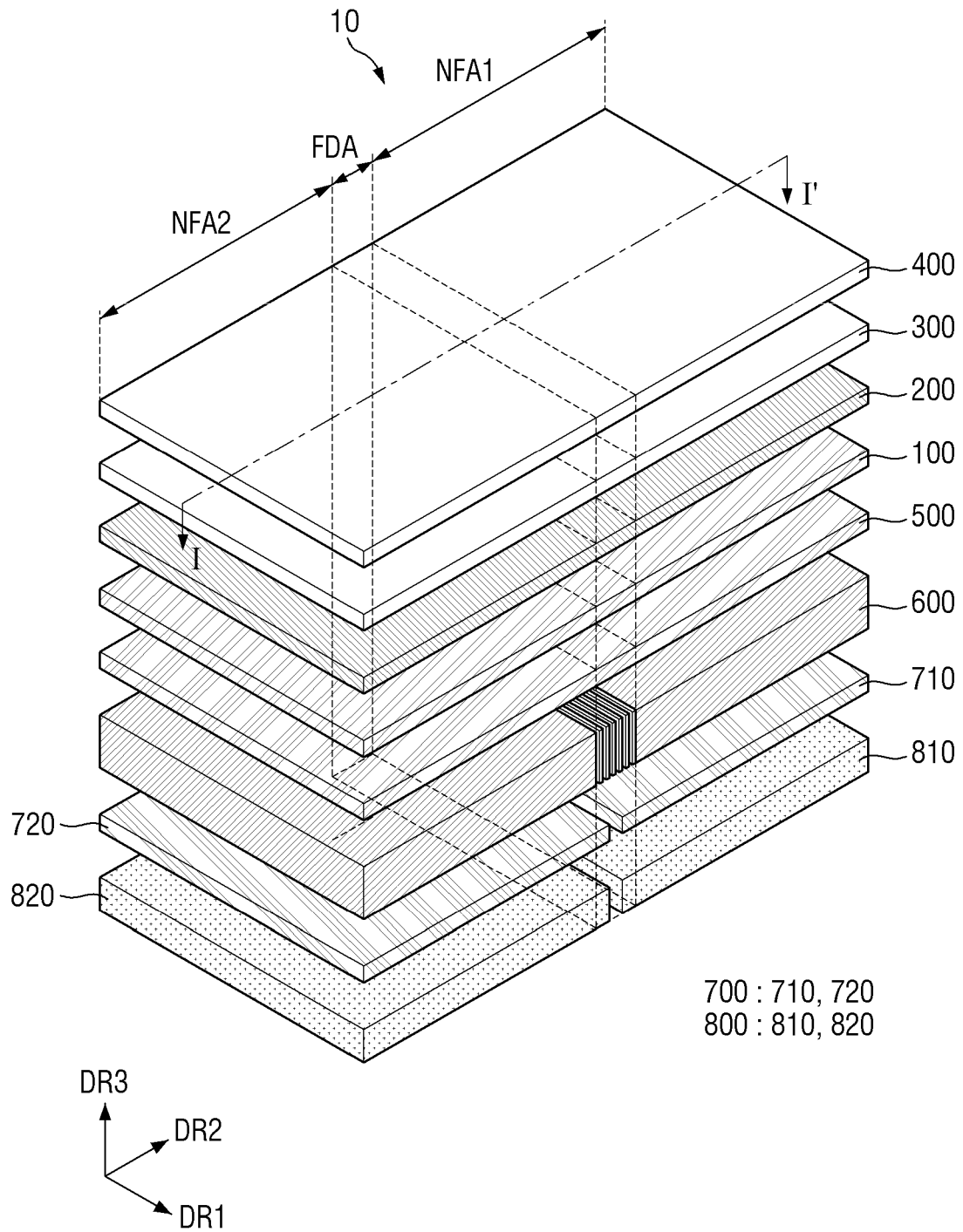
FIG. 5 is an exploded schematic perspective view illustrating an example of the display device of FIG. 1.
Figure 6:
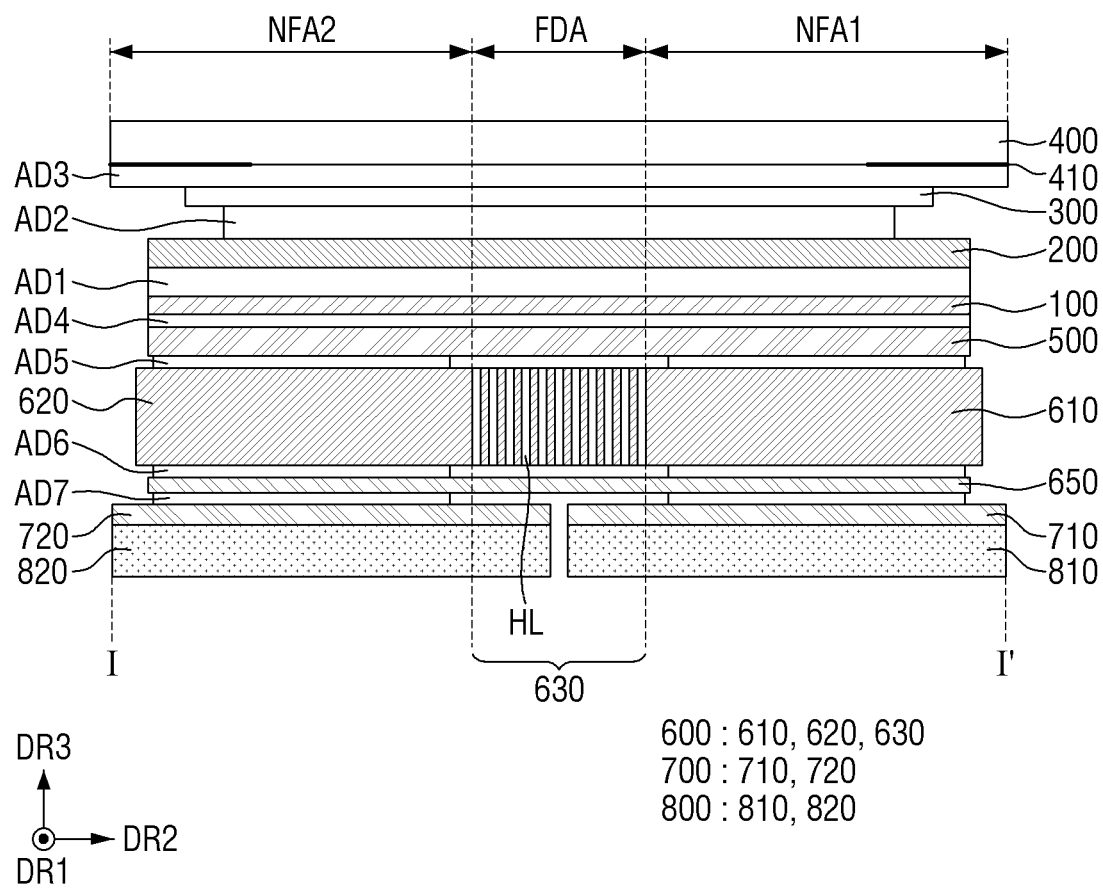
FIG. 6 is a schematic cross-sectional view illustrating an example of a display device taken along line I-I' of FIG. 5.

FIG. 5 is an exploded schematic perspective view illustrating an example of the display device of FIG. 1. FIG. 6 is a schematic cross-sectional view illustrating an example of a display device taken along line I-I' of FIG. 5.

Referring to FIGS. 5 and 6, the display device 10 according to an embodiment may include a display panel 100, a polarizing film 200, a window 300, a protective film 400, a panel lower member 500, a digitizer 600, a shielding member 700 and a heat dissipation member 800.

A detailed description of the display panel 100 will be described below with reference to FIG. 7.

The polarizing film 200 may be disposed on a front surface of the display panel 100. The front surface of the display panel 100 may be a display surface on which an image is displayed. The polarizing film 200 may be attached to the front surface of the display panel 100 by a first adhesive member AD1. The first adhesive member AD1 may be an optically clear adhesive (OCA) film or an optically clear resin (OCR). The polarizing film 200 may include a linear polarizing plate and a phase delay film such as a quarter-wave ($\lambda/4$) plate.

The window 300 may be disposed on a front surface of the polarizing film 200. The window 300 may be attached to the front surface of the polarizing film 200 by the second adhesive member AD2. The second adhesive member AD2 may be a transparent adhesive film or a transparent adhesive resin. The window 300 may be made of a transparent material, and may include, for example, glass or plastic. For example, the window 300 may be an ultra thin glass (UTG) having a thickness of about 0.1 mm or less, or a transparent polyimide film, but embodiments are not limited thereto.

The protective film 400 may be disposed on a front surface of the window 300. The protective film 400 may be attached to the front surface of the window 300 by a third adhesive member AD3. The third adhesive member AD3 may be a transparent adhesive film or a transparent adhesive resin. The protective film 400 may perform at least one function of anti-scattering, shock absorption, anti-scratch, anti-fingerprinting or anti-glare of the window 300.

A light shielding layer 410 may be disposed on a rear surface of the protective film 400. The light shielding layer 410 may be disposed at an edge portion of the protective film 400. The light shielding layer 410 may include a light shielding material capable of shielding light. For example, the light shielding layer 410 may include an inorganic black pigment such as carbon black pigment or an organic black pigment.

The panel lower member 500 may be disposed on a rear surface of the display panel 100. The panel lower member 500 may be attached to the rear surface of the display panel 100 by a fourth adhesive member AD4. The fourth adhesive member AD4 may be a pressure sensitive adhesive (PSA).

The panel lower member 500 may be a buffer layer for absorbing an external impact. The panel lower member 500 may absorb the external impact to prevent the display panel 100 from being damaged. The panel lower member 500 may be formed of a single layer or multiple layers. For example, the buffer layer may include a material having elasticity such as rubber, urethane-based material or sponge foam-molded from an acrylic-based material.

In FIGS. 5 and 6, the panel lower member 500 is illustrated as being disposed in the folding area FDA, but embodiments are not limited thereto. For example, the panel lower member 500 may be removed from the folding area FDA so that the display device 10 may be smoothly folded.

The digitizer 600 may be disposed on a rear surface of the panel lower member 500, and may include a first non-folding portion 610, a second non-folding portion 620 and a folding portion 630.

The first non-folding portion 610 may overlap at least a portion of the first non-folding area NFA1. The second non-folding portion 620 may overlap at least a portion of the second non-folding area NFA2. The folding portion 630 may overlap the folding area FDA. Therefore, the folding portion 630 may be disposed between the first non-folding portion 210 and the second non-folding portion 220.

A width of the folding portion 630 of the digitizer 600 according to an embodiment in the first direction DR1 may be in a range of about 5 mm to about 20 mm. However, the width of the folding portion 630 of the digitizer 600 is not limited to the above range thereof.

A thickness of the digitizer 600 according to an embodiment in the third direction DR3 may be in a range of about 30 μm to about 300 μm. However, the thickness of the digitizer 600 is not limited to the above range thereof.

In case that the width of the folding portion 630 of the digitizer 600 and the thickness of the digitizer 600 have the above ranges thereof, respectively, the digitizer 600 may be disposed on the rear surface of the display panel 100 so as to sufficiently support the display panel 100 and at the same time to ensure flexibility of the folding portion 630 of the digitizer 600 corresponding to (or overlapping) the folding area FDA of the display device 10 during a folding operation of the display device 10, whereby a shape of the digitizer 600 may be readily changed.

The digitizer 600 may include holes HL disposed in the folding area FDA so that it is readily bent in the folding area FDA. For example, the folding portion 630 of the digitizer 600 may include holes HL that penetrate (or pass through) the folding portion 630 in the third direction DR3. The holes HL may correspond to the folding area FDA, and may be spaced apart from each other along the first direction DR1 and the second direction DR2.

The digitizer 600 may have a structure in which prepregs are stacked. For example, the prepregs may include reinforcement materials (or reinforcing fabric) that are pre-impregnated with a resin. For example, the digitizer 600 may have a structure in which first prepregs parallel with the first and second folding lines FL1 and FL2 and second prepregs orthogonal to the first and second folding lines FL1 and FL2 are alternately stacked. The first prepregs and the second prepregs may be stacked by a thermal pressure press or an auto clave. This will be described below with reference to FIGS. 13 and 14.

A base layer of the digitizer 600 according to an embodiment, on which sensing coils are to be disposed, may include a reinforced fiber composite. The digitizer 600 may include a reinforced fiber disposed inside a matrix portion. The reinforced fiber may be a carbon fiber or a glass fiber.

For example, the reinforced fiber may be epoxy, polyester, polyamide, polycarbonate, polypropylene, polybutylene and vinyl ester.

The matrix portion may include a polymer resin. The matrix portion may include a thermoplastic resin. The sensing coils may be disposed on front and rear surfaces of the base layer and insulated from each other. The elements of the digitizer 600 will be described below.

The digitizer 600 may include electrode pattern layers for sensing an approach or contact of an electronic pen, such as a stylus pen, which supports electromagnetic resonance (EMR). For example, the digitizer 600 may sense a magnetic field or an electromagnetic signal, which is emitted from the electronic pen, based on the electrode pattern layers, and may determine a point, at which the sensed magnetic field or electromagnetic signal is the largest, as touch coordinates.

The digitizer 600 may be attached to the rear surface of the panel lower member 500 by fifth adhesive members AD5. The fifth adhesive members AD5 may not be disposed in the folding area FDA in order to reduce folding stress of the display device 10. One of the fifth adhesive members AD5 may be disposed in the first non-folding area NFA1 and the other one thereof may be disposed in the second non-folding area NFA2. In an embodiment, the fifth adhesive members AD5 may be pressure-sensitive adhesives, but embodiments are not limited thereto.

A buffer member 650 may be disposed on a rear surface of the digitizer 600. The buffer member 650 may be attached to the rear surface of the digitizer 600 by sixth adhesive members AD6. The sixth adhesive members AD6 may not be disposed in the folding area FDA in order to reduce folding stress of the display device 10. For example, one of the sixth adhesive members AD6 may be disposed in the first non-folding area NFA1, and the other one thereof may be disposed in the second non-folding area NFA2. The sixth adhesive members AD6 may be pressure-sensitive adhesives.

The buffer member 650 may absorb an external impact to prevent the digitizer 600 from being damaged. The buffer member 650 may include a material having elasticity such as rubber, urethane-based material or sponge foam-molded from an acrylic-based material.

The shielding member 700 may include a first shielding member 710 and a second shielding member 720. The first shielding member 710 and the second shielding member 720 may be disposed on a rear surface of the buffer member 650. The first shielding member 710 and the second shielding member 720 may be attached to the rear surface of the buffer member 650 by seventh adhesive members AD7. The seventh adhesive members AD7 may be pressure-sensitive adhesives.

In an embodiment, the first shielding member 710, the second shielding member 720 and the seventh adhesive members AD7 may not be disposed in the folding area FDA in order to reduce folding stress of the display device 10. The first shielding member 710 may be disposed in the first non-folding area NFA1, and the second shielding member 720 may be disposed in the second non-folding area NFA2. A gap between the first shielding member 710 and the second shielding member 720 may overlap the folding area FDA, and may be smaller than the width of the folding area FDA, but embodiments are not limited thereto.

The first shielding member 710 and the second shielding member 720 may include magnetic metal powder such that the magnetic field or the electromagnetic signal may pass through the digitizer 600 to flow into the first shielding member 710 and the second shielding member 720. Therefore, the first shielding member 710 and the second shielding member 720 may reduce emission of the magnetic field or the electromagnetic signal to rear surfaces of the first shielding member 710 and the second shielding member 720.

The heat dissipation member 800 may include a first heat dissipation member 810 and a second heat dissipation member 820. The first heat dissipation member 810 and the second heat dissipation member 820 may be disposed on the rear surface of the shielding member 700.

In an embodiment, the first heat dissipation member 810 and the second heat dissipation member 820 may not be disposed in the folding area FDA in order to reduce folding stress of the display device 10. For example, the first heat dissipation member 810 may be disposed in the first non-folding area NFA1, and the second heat dissipation member 820 may be disposed in the second non-folding area NFA2. The gap between the first heat dissipation member 810 and the second heat dissipation member 820 may overlap the folding area FDA, and may be smaller than the width of the folding area FDA.

The first heat dissipation member 810 and the second heat dissipation member 820 may be metal films such as copper, nickel, ferrite or silver, which has excellent thermal conductivity. Therefore, heat generated in the display device 10 may be emitted to the outside by the first heat dissipation member 810 and the second heat dissipation member 820.

Figure 7:
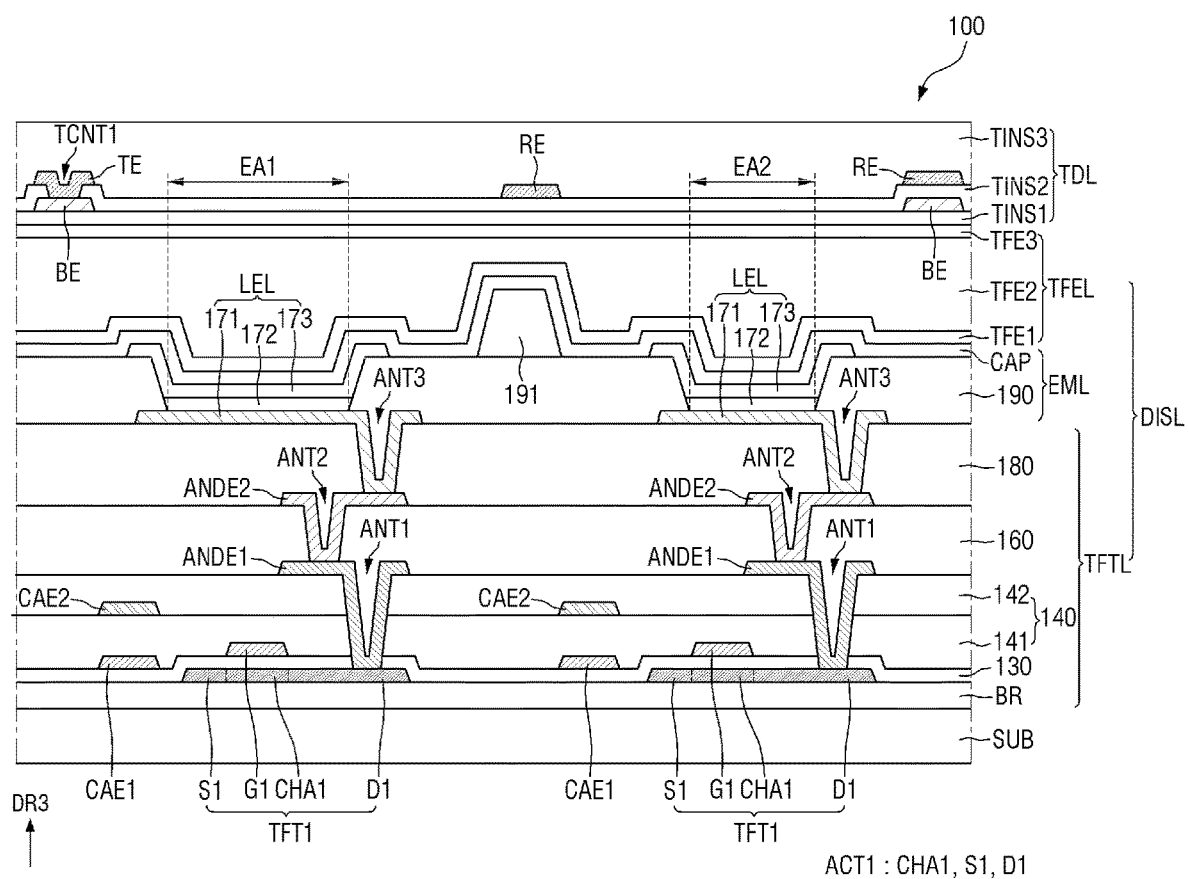
FIG. 7 is a schematic cross-sectional view illustrating an example of a display panel according to an embodiment.

FIG. 7 is a schematic cross-sectional view illustrating an example of the display panel of FIGS. 5 and 6.

Referring to FIG. 7, a display layer DISL may be disposed on a substrate SUB. The display layer DISL may include a thin film transistor layer TFTL, a light emitting element layer EML, and an encapsulation layer TFEL.

The thin film transistor layer TFTL may be disposed on the substrate SUB. The thin film transistor layer TFTL may include a barrier layer BR, a thin film transistor TFT1, a first capacitor electrode CAE1, a second capacitor electrode CAE2, a first anode connection electrode ANDE1, a second anode connection electrode ANDE2, a gate insulating layer 130, a first interlayer insulating layer 141, a second interlayer insulating layer 142, a first planarization layer 160 and a second planarization layer 180.

The substrate SUB may be made of an insulating material such as a polymer resin. For example, the substrate SUB may be made of polyimide. The substrate SUB may be a flexible substrate that is bendable, foldable, rollable, or the like.

The barrier layer BR may be disposed on the substrate SUB. The barrier layer BR may be a layer for protecting the thin film transistors of the thin film transistor layer TFTL and a light emitting layer 172 of the light emitting element layer EML from moisture permeated through the substrate SUB vulnerable to moisture permeation. The barrier layer BR may include inorganic layers that are alternately stacked. For example, the barrier layer BR may be formed as multiple layers in which one or more inorganic layers of a silicon nitride layer, a silicon oxynitride layer, a silicon oxide layer, a titanium oxide layer and an aluminum oxide layer are alternately stacked.

The thin film transistor TFT1 may be disposed on the barrier layer BR. An active layer ACT1 of the thin film transistor TFT1 may be disposed on the barrier layer BR. The active layer ACT1 of the thin film transistor TFT1 may include polycrystalline silicon, monocrystalline silicon, low temperature polycrystalline silicon, amorphous silicon or an oxide semiconductor.

The active layer ACT1 may include a channel area CHA1, a source area S1 and a drain area D1. The channel area CHA1 may be an area that overlaps a gate electrode G1 in the third direction DR3 that is a thickness direction of the substrate SUB. The source area S1 may be disposed at a side of the channel area CHA1, and the drain area D1 may be disposed at another side of the channel area CHA1 The source area S1 and the drain area D1 may be areas that do not overlap the gate electrode G1 in the third direction DR3. The source area S1 and the drain area D1 may be areas doped with ions or impurities in a silicon semiconductor or an oxide semiconductor to have conductivity.

The gate insulating layer 130 may be disposed on the active layer ACT1 of the thin film transistor TFT1. The gate insulating layer 130 may be formed of an inorganic layer, for example, a silicon nitride layer, a silicon oxynitride layer, a silicon oxide layer, a titanium oxide layer or an aluminum oxide layer.

The gate electrode G1 and the first capacitor electrode CAE1 of the thin film transistor TFT1 may be disposed on the gate insulating layer 130. The gate electrode G1 may overlap the active layer ACT1 in the third direction DR3. In FIG. 7, the gate electrode G1 and the first capacitor electrode CAE1 are shown as being spaced apart from each other, but the gate electrode G1 and the first capacitor electrode CAE1 may be connected (e.g., electrically connected) to each other to be integral with each other. The gate electrode G1 and the first capacitor electrode CAE1 may be formed as a single layer or multiple layers formed of any one of molybdenum (Mo), aluminum (Al), chromium (Cr), gold (Au), titanium (Ti), nickel (Ni), neodymium (Nd) and copper (Cu), or their alloy.

The first interlayer insulating layer 141 may be disposed on the gate electrode G1 and the first capacitor electrode CAE1 of the thin film transistor TFT1. The first interlayer insulating layer 141 may be formed of an inorganic layer, for example, a silicon nitride layer, a silicon oxynitride layer, a silicon oxide layer, a titanium oxide layer or an aluminum oxide layer. The first interlayer insulating layer 141 may be formed of inorganic layers.

The second capacitor electrode CAE2 may be disposed on the first interlayer insulating layer 141. The second capacitor electrode CAE2 may overlap the first capacitor electrode CAE1 of the thin film transistor TFT1 in the third direction DR3. For example, in case that the gate electrode G1 and the first capacitor electrode CAE1 are integral with each other, the second capacitor electrode CAE2 may overlap the gate electrode G1 in the third direction DR3. Since the first interlayer insulating layer 141 has a certain dielectric constant, a capacitor may be formed by the first capacitor electrode CAE1, the second capacitor electrode CAE2 and the first interlayer insulating layer 141 disposed between the first capacitor electrode CAE1 and the second capacitor electrode CAE2. The second capacitor electrode CAE2 may be formed of a single layer or multiple layers formed of any one of molybdenum (Mo), aluminum (Al), chromium (Cr), gold (Au), titanium (Ti), nickel (Ni), neodymium (Nd) and copper (Cu), or their alloy.

The second interlayer insulating layer 142 may be disposed on the second capacitor electrode CAE2. The second interlayer insulating layer 142 may be formed of an inorganic layer, for example, a silicon nitride layer, a silicon oxynitride layer, a silicon oxide layer, a titanium oxide layer or an aluminum oxide layer. The second interlayer insulating layer 142 may be formed of inorganic layers.

The first anode connection electrode ANDE1 may be disposed on the second interlayer insulating layer 142. The first anode connection electrode ANDE1 may be connected (e.g., electrically connected) to the drain area D1 of the thin film transistor TFT1 through a first connection contact hole ANT1 passing through the gate insulating layer 130, the first interlayer insulating layer 141 and the second interlayer insulating layer 142. The first anode connection electrode ANDE1 may be formed of a single layer or multiple layers formed of any one of molybdenum (Mo), aluminum (Al), chromium (Cr), gold (Au), titanium (Ti), nickel (Ni), neodymium (Nd) and copper (Cu), or their alloy.

The first planarization layer 160 for planarizing a step difference due to the thin film transistor TFT1 may be disposed on the first anode connection electrode ANDE1. The first planarization layer 160 may be formed of an organic layer such as acryl resin, epoxy resin, phenolic resin, polyamide resin or polyimide resin.

The second anode connection electrode ANDE2 may be disposed on the first planarization layer 160. The second anode connection electrode ANDE2 may be connected (e.g., electrically connected) to the first anode connection electrode ANDE1 through a second connection contact hole ANT2 passing through the first planarization layer 160. The second anode connection electrode ANDE2 may be formed of a single layer or multiple layers formed of any one of molybdenum (Mo), aluminum (Al), chromium (Cr), gold (Au), titanium (Ti), nickel (Ni), neodymium (Nd) and copper (Cu), or their alloy.

The second planarization layer 180 may be disposed on the second anode connection electrode ANDE2. The second planarization layer 180 may be formed of an organic layer such as acryl resin, epoxy resin, phenolic resin, polyamide resin or polyimide resin.

The light emitting element layer EML, which includes light emitting elements LEL and a bank 190, may be disposed on the second planarization layer 180. Each of the light emitting elements LEL may include a pixel electrode 171, a light emitting layer 172 and a common electrode 173.

The pixel electrode 171 may be disposed on the second planarization layer 180. The pixel electrode 171 may be connected (e.g., electrically connected) to the second anode connection electrode ANDE2 through a third connection contact hole ANT3 passing through the second planarization layer 180.

In a top emission structure (or front emission structure) in which light is emitted in a direction of the common electrode 173 based on the light emitting layer 172, the pixel electrode 171 may be formed of a metal material having high reflectance, such as a stacked structure (Ti/Al/Ti) of aluminum (Al) and titanium (Ti), a stacked structure (ITO/Al/ITO) of aluminum (Al) and indium tin oxide (ITO), a stacked structure (ITO/Ag/ITO) of silver (Ag) and ITO, an APC alloy, or a stacked structure (ITO/APC/ITO) of APC alloy and ITO. The APC alloy may be an alloy of silver (Ag), palladium (Pd) and copper (Cu).

The bank 190 may be formed to partition the pixel electrode 171 on the second planarization layer 180 in order to define a first light emitting portion EA1 and a second light emitting portion EA2. The bank 190 may cover an edge portion of the pixel electrode 171. The bank 190 may be formed of an organic layer such as acryl resin, epoxy resin, phenolic resin, polyamide resin or polyimide resin.

Each of the first light emitting portion EA1 and the second light emitting portion EA2 indicates an area in which the pixel electrode 171, the light emitting layer 172 and the common electrode 173 may be sequentially stacked so that holes from the pixel electrode 171 and electrons from the common electrode 173 may be recombined in the light emitting layer 172 to emit light.

The light emitting layer 172 may be disposed on the pixel electrode 171 and the bank 190. The light emitting layer 172 may include an organic material to emit light of a certain color. For example, the light emitting layer 172 may include a hole transporting layer, an organic material layer and an electron transporting layer.

The common electrode 173 may be disposed on the light emitting layer 172. The common electrode 173 may cover the light emitting layer 172. The common electrode 173 may be a common layer commonly formed in the first light emitting portion EA1 and the second light emitting portion EA2. A capping layer CAP may be formed on the common electrode 173.

In the top emission structure (or front emission structure), the common electrode 173 may be formed of a transparent conductive material (TCO) such as ITO and IZO, or a semi-transmissive conductive material such as magnesium (Mg), silver (Ag) or an alloy of magnesium (Mg) and silver (Ag). In case that the common electrode 173 is formed of a semi-transmissive conductive material, light output efficiency may be enhanced by a micro cavity.

A spacer 191 may be disposed on the bank 190. The spacer 191 may function to support a mask during a manufacturing process of manufacturing the light emitting layer 172. The spacer 191 may be formed of an organic layer such as acryl resin, epoxy resin, phenolic resin, polyamide resin or polyimide resin.

The encapsulation layer TFEL may be disposed on the capping layer CAP (or the common electrode 173). The encapsulation layer TFEL may include at least one inorganic layer to prevent oxygen or moisture from being permeated into the light emitting element layer EML. The encapsulation layer TFEL may include at least one organic layer to protect the light emitting element layer EML from particles such as dust. For example, the encapsulation layer TFEL may include a first encapsulation inorganic layer TFE1, an encapsulation organic layer TFE2 and a second encapsulation inorganic layer TFE3.

The first encapsulation inorganic layer TFE1 may be disposed on the common electrode 173, the encapsulation organic layer TFE2 may be disposed on the first encapsulation inorganic layer TFE1, and the second encapsulation inorganic layer TFE3 may be disposed on the encapsulation organic layer TFE2. The first encapsulation inorganic layer TFE1 and the second encapsulation inorganic layer TFE3 may be formed of multiple layers in which one or more inorganic layers of a silicon nitride layer, a silicon oxynitride layer, a silicon oxide layer, a titanium oxide layer and an aluminum oxide layer are alternately stacked. The encapsulation organic layer TFE2 may be an organic layer such as acryl resin, epoxy resin, phenolic resin, polyamide resin or polyimide resin.

A touch sensing layer TDL may be disposed on the encapsulation layer TFEL. The touch sensing layer may include a first touch insulating layer TINS1, a connection electrode BE, a second touch insulating layer TINS2, a driving electrode TE, a sensing electrode RE and a third touch insulating layer TINS3.

The first touch insulating layer TINS1 may be disposed on the encapsulation layer TFEL. The first touch insulating layer TINS1 may be formed of an inorganic layer, for example, a silicon nitride layer, a silicon oxynitride layer, a silicon oxide layer, a titanium oxide layer or an aluminum oxide layer.

The connection electrode BE may be disposed on the first touch insulating layer TINS1. The connection electrode BE may be formed as a single layer or multiple layers made of one of molybdenum (Mo), aluminum (Al), chromium (Cr), gold (Au), titanium (Ti), nickel (Ni), neodymium (Nd) and copper (Cu), or their alloy.

The second touch insulating layer TINS2 may be disposed on the connection electrode BE. The second touch insulating layer TINS2 may be formed of an inorganic layer, for example, a silicon nitride layer, a silicon oxynitride layer, a silicon oxide layer, a titanium oxide layer or an aluminum oxide layer. In another example, the second touch insulating layer TINS2 may be formed of an organic layer such as acryl resin, epoxy resin, phenolic resin, polyamide resin or polyimide resin.

Driving electrodes TE and sensing electrodes RE may be disposed on the second touch insulating layer TINS2. In addition to the driving electrodes TE and the sensing electrodes RE, dummy pattern layers DE, first touch driving lines TL1, second touch driving lines TL2 and touch sensing lines RL, which are shown in FIG. 4, may be disposed on the second touch insulating layer TINS2. The driving electrodes TE and the sensing electrodes RE may be formed of a single layer or multiple layers formed of any one of molybdenum (Mo), aluminum (Al), chromium (Cr), gold (Au), titanium (Ti), nickel (Ni), neodymium (Nd) and copper (Cu), or their alloy.

The driving electrode TE and the sensing electrode RE may overlap the connection electrode BE in the third direction DR3. The driving electrode TE may be connected (e.g., electrically connected) to the connection electrode BE through a touch contact hole TCNT1 passing through the first touch insulating layer TINS1.

The third touch insulating layer TINS3 may be formed on the driving electrodes TE and the sensing electrodes RE. The third touch insulating layer TINS3 may function to planarize a step difference formed due to the driving electrodes TE, the sensing electrodes RE and the connection electrodes BE. The third touch insulating layer TINS3 may be formed of an organic layer such as acryl resin, epoxy resin, phenolic resin, polyamide resin or polyimide resin.

Figure 8:
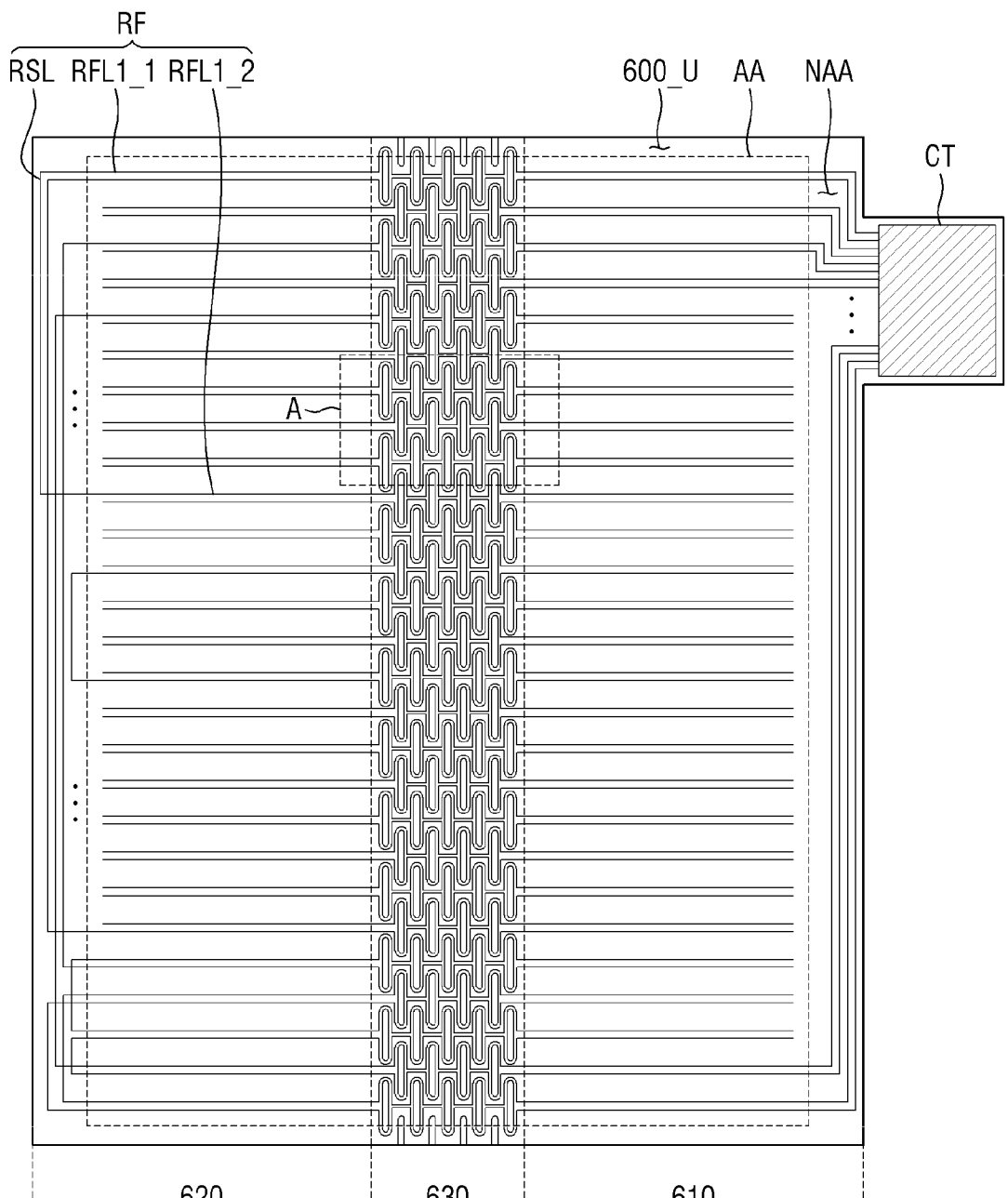
FIG. 8 is a schematic plan view illustrating a digitizer according to an embodiment.
Figure 9:
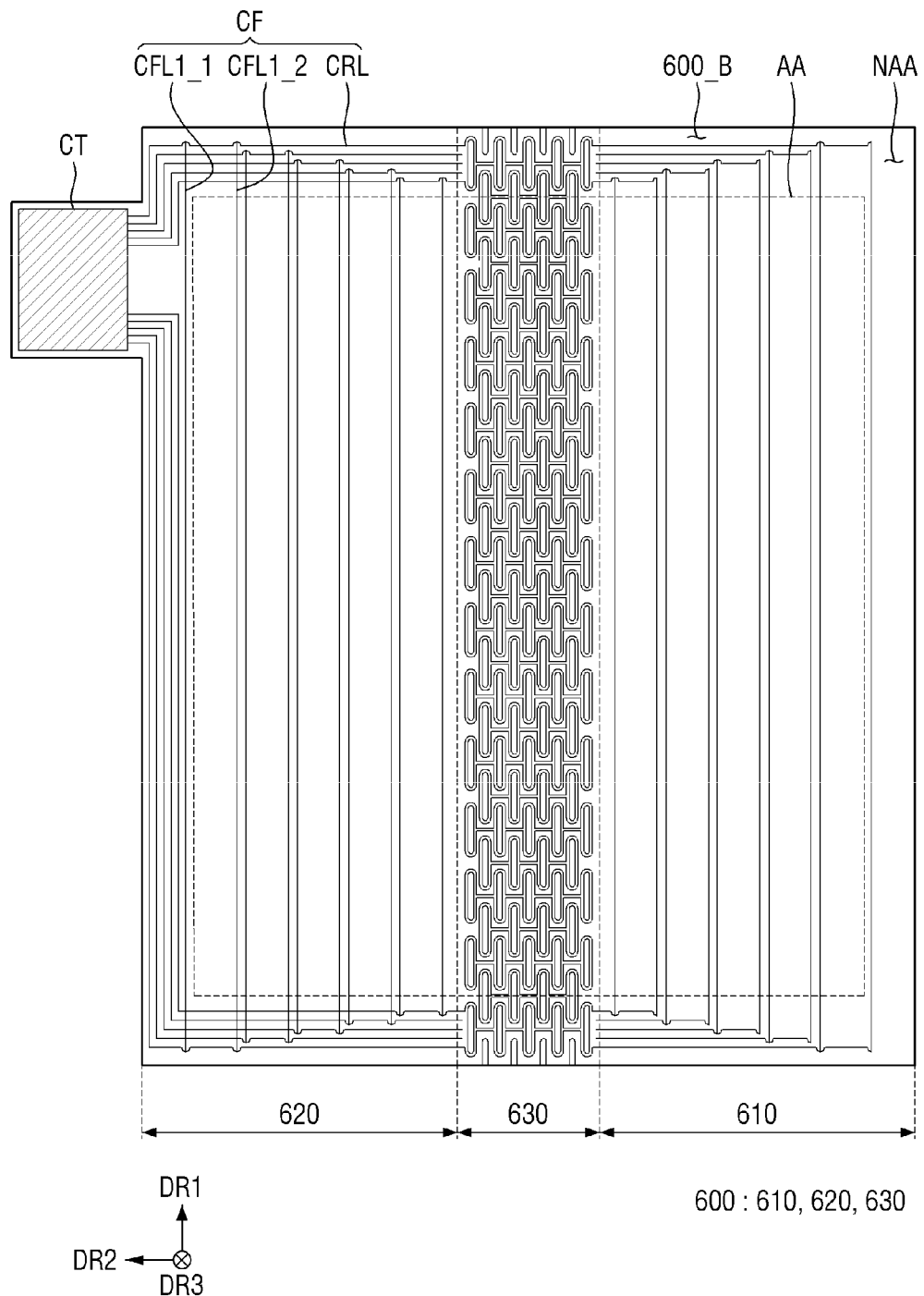
FIG. 9 is a schematic rear view illustrating a digitizer according to an embodiment.

FIG. 8 is a schematic plan view illustrating a digitizer according to an embodiment. FIG. 9 is a rear schematic view illustrating a digitizer according to an embodiment.

FIG. 8 illustrates sensing coils disposed on a front surface 600_U of the digitizer 600 according to an embodiment, and FIG. 9 illustrates sensing coils disposed on a rear surface 600_B of the digitizer 600.

Referring to FIGS. 8 and 9, the digitizer 600 may include an active area AA and a peripheral area NAA. For example, the digitizer 600 may include sensing coils RF and CF and a connector CT.

The active area AA of the digitizer 600 may overlap the display area DA of the display device 10, and the peripheral area NAA may overlap the non-display area NDA of the display device 10. The active area AA may be defined as an area for sensing an input of a pen, and the peripheral area NAA may be an area in which connection lines for forming a loop of each of the sensing coils RF and CF are disposed.

Each of the first sensing coils RF may include first long sides RFL1_1 and second long sides RFL1_2, which extend in the second direction DR2, and short sides RSL connecting an end portion of each of the first long sides RFL1_1 to an end portion of each of the second long sides RFL1_2. For example, the short sides RSL may be spaced apart from each other in the second direction DR2.

Lengths of the short sides RSL in the first direction DR1 according to an embodiment may be different from each other. Therefore, widths in the first direction DR1 between the first long sides RFL1_1 and the second long sides RFL1_2, which are included in each of the first sensing coils RF, may be different from each other, but embodiments are not limited thereto. The lengths of the respective short sides RSL in the first direction DR1 may be the same as each other, and the respective first sensing coils RF forming a single loop may be spaced apart from each other.

A portion across the folding portion 630 of the digitizer 600 among the first long sides RFL1_1 and the second long sides RFL1_2, which are included in each of the first sensing coils RF, may extend from the first non-folding portion 610 to the second non-folding portion 620 via the holes HL. This will be described below with reference to FIG. 10.

An end portion of each of the first sensing coils RF extending to the peripheral area NAA may be connected (e.g., electrically connected) to the connector CT.

The first long sides RFL1_1 and the second long sides RFL1_2 and the short sides RSL, which are included in each of the first sensing coils RF according to an embodiment, may be disposed on different layers. For example, the short sides RSL may be disposed on the same layer as the second sensing coils CF that will be described below.

Each of the second sensing coils CF may include third long sides CFL1_1 and fourth long sides CFL1_2, which extend in the first direction DR1, and routing lines CRL connecting an end portion of each of the third long sides CFL1_1 to an end portion of each of the fourth long sides CFL1_2. For example, the routing lines CRL may be spaced apart from each other in the first direction DR1.

The lines disposed in the folding portion 630 of the digitizer 600 among the third long sides CFL1_1 and the fourth long sides CFL1_2, which are included in each of the second sensing coils CF, may be arranged in the first direction DR1, and may be disposed between hole HL groups spaced apart from each other along the second direction DR2.

For example, a line, which is disposed in the folding portion 630, among the routing lines CRL may be connected (e.g., electrically connected) to corresponding an end portion of each of the third long sides CFL1_1 and the fourth long sides CFL1_2 via the holes HL.

An end portion of each of the second sensing coils CF extending to the peripheral area NAA may be connected (e.g., electrically connected) to the connector CT like the first sensing coils RF.

In the embodiment shown in FIGS. 8 and 9, the second sensing coils CF may be referred to as driving coils, and the first sensing coils RF may be referred to as sensing coils, but embodiments are not limited thereto and vice versa. In case that a current flows to the second sensing coils CF, a magnetic force line may be induced between the second sensing coils CF and the first sensing coils RF. The first sensing coils RF may sense induced electromagnetic force emitted from the electromagnetic pen and may output the sensed electromagnetic force to a terminal of each of the first sensing coils RF as a sensing signal. A terminal of each of the first sensing coils RF may be connected (e.g., electrically connected) to signal lines disposed in the peripheral area NAA.

Figure 10:
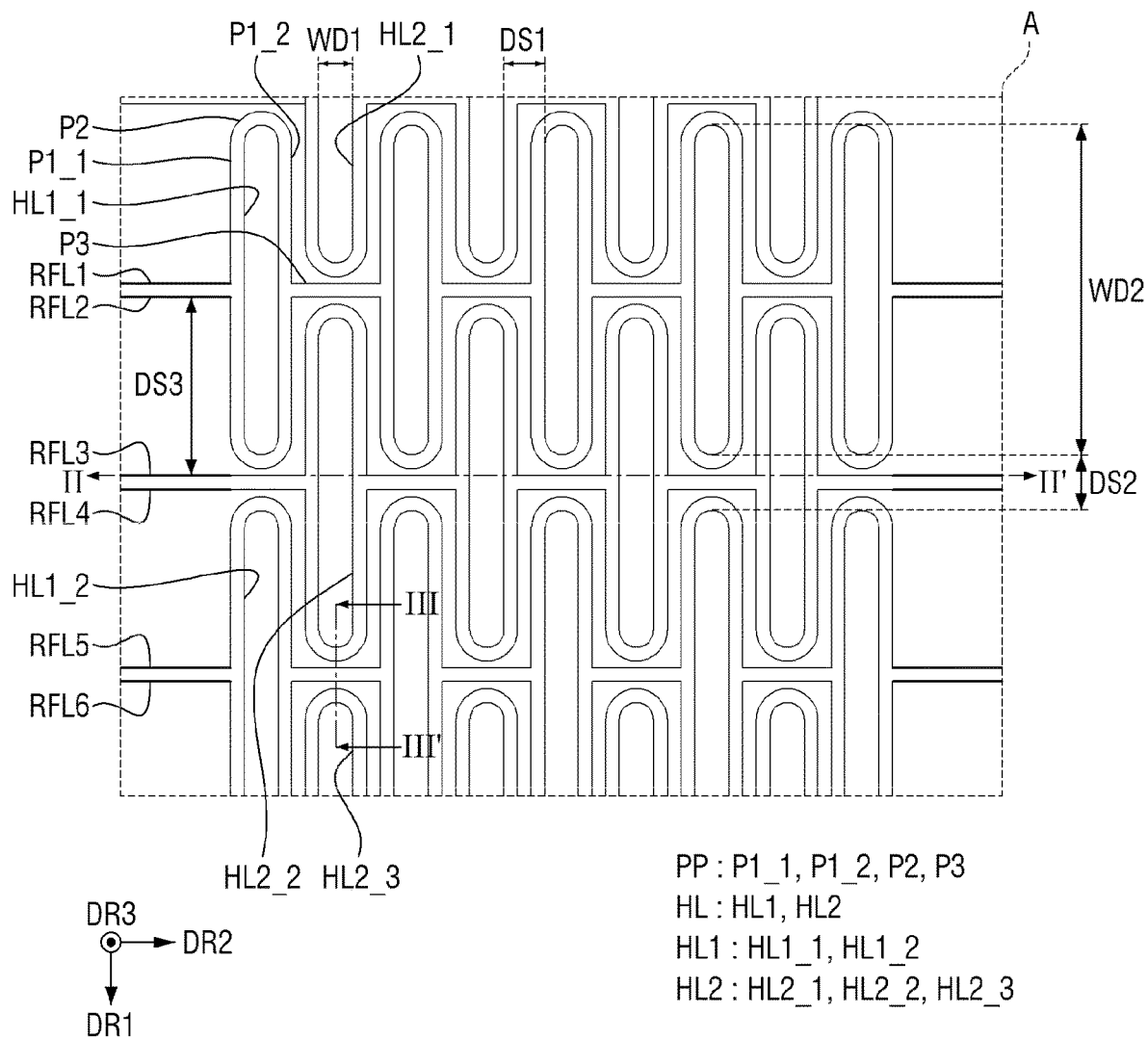
FIG. 10 is a schematic plan view illustrating an area 'A' of FIG. 8.

FIG. 10 is a schematic plan view illustrating an area 'A' of FIG. 8.

FIG. 10 illustrates coils RFL1, RFL2, RFL3, RFL4, RFL5 and RFL6, which form different loops, among the first sensing coils RF.

Each of the holes HL included in the folding portion 630 of the digitizer 600 according to an embodiment may have a first width WD1 in the second direction DR2. The first width WD1 may be in a range of about 4 mm to about 10 mm. Each of the holes HL may have a second width WD2 in the first direction DR1. The second width WD2 may be in a range of about 0.1 mm to about 0.5 mm. However, the first width WD1 and the second width WD2 of the holes HL are not limited to the above ranges thereof.

The holes HL included in the folding portion 630 may include a first group hole HL1 and a second group hole HL2. For example, the first group hole HL1 may include a $(1-1)^{th}$ hole HL1_1 and a $(1-2)^{th}$ hole HL1_2, which are arranged to be spaced apart from each other along the first direction DR1.

The second group hole HL2 may include a $(2-1)^{th}$ hole HL2_1, a $(2-2)^{th}$ hole HL2_2 and a $(2-3)^{th}$ hole HL2_3, which are spaced apart from the first group hole HL1 in the second direction DR2 and arranged to be spaced apart from one another along the first direction DR1.

As shown in FIG. 10, the second group hole HL2 may be shifted from the first group hole HL1 in the first direction DR1 as much as a certain distance.

According to an embodiment, the shifted distance may be less than a half of the second width WD2. Therefore, the first group hole HL1 and the second group hole HL2 may partially overlap each other in the first direction DR1 as the first group hole HL1 and the second group hole HL2 are alternately spaced apart from each other. Therefore, a shape of the digitizer 600 except for the holes HL of the folding portion 630 may have a slit shape of a grid pattern on a plane.

According to an embodiment, in case that the holes included in the different group holes HL1 and HL2 are viewed in the second direction DR2, a first spaced distance DS1 between overlapped holes, for example, the first spaced distance DS1 in the second direction DR2 between the $(1-1)^{th}$ hole HL1_1 of the first group hole HL1 and the $(2-1)^{th}$ hole HL2_1 of the second group hole HL2 may be in a range of about 0.1 mm to about 0.3 mm.

A second spaced distance DS2 in the first direction DR1 between holes HL adjacent to each other in the second direction DR2 among the holes included in the same group hole, for example, the second spaced distance DS2 in the first direction DR1 between the $(1-1)^{th}$ hole HL1_1 and the $(1-2)^{th}$ hole HL1_2, which are included in the first group hole HL1, may be in a range of about 0.1 mm to about 0.5 mm.

An interval (or distance) in the first direction DR1 between the long sides facing each other among the long sides of the coils RFL1, RFL2, RFL3, RFL4, RFL5 and RFL6, which are disposed between the holes HL where the coils RFL1, RFL2, RFL3, RFL4, RFL5 and RFL6 are partially adjacent to one another in the second direction DR2, may be substantially equal to or less than a half of a sum of the second width WD2 and the second spaced distance DS2.

For example, a spaced distance between a long side of the second coil RFL2 and a long side of the third coil RFL3, which are respectively disposed in the first non-folding portion (see '610' in FIG. 8) and the second non-folding portion (see '620' in FIG. 8) may be substantially equal to or less than the half of the sum of the second width WD2 and the second spaced distance DS2.

For another example, a spaced distance in the first direction DR1 between a long side of the fourth coil RFL4 and a long side of the fifth coil RFL5 may be substantially equal to or less than the half of the sum of the second width WD2 and the second spaced distance DS2.

Each of the coils RFL1, RFL2, RFL3, RFL4, RFL5 and RFL6 disposed in the folding portion 630 among the coils RFL1, RFL2, RFL3, RFL4, RFL5 and RFL6 forming different loops may include a pattern portion PP.

The pattern portion PP may cross (or extend) between the holes HL. Pattern portions PP may be provided (or formed) in a coil, and the pattern portions PP may be arranged along the first direction DR1.

According to an embodiment, the pattern portion PP may include first pattern layers P1_1 and P1_2, a second pattern layer P2, and a third pattern layer P3.

Each of the first pattern layers P1_1 and P1_2 may extend in the first direction DR1, and may be spaced apart from each other along the second direction DR2 with a hole HL interposed therebetween. For example, the first pattern layers P1_1 and P1_2 may include a (1-1)th pattern layer P1_1 disposed at a side of the hole HL in the second direction DR2 and a (1-2)th pattern layer P1_2 disposed at another side of the hole HL in the second direction DR2, with a hole HL interposed therebetween.

The second pattern layer P2 may be connected (e.g., electrically connected) to an end portion of each of the first pattern layers P1_1 and P1_2 to connect the first pattern layers P1_1 and P1_2 with each other. The second pattern layer P2 may include a certain curvature corresponding to an edge portion of the hole HL.

The third pattern layer P3 may be connected (e.g., electrically connected) to another end portion of the $(1-2)^{th}$ pattern layer P1_2 and another end portion of the $(1-1)^{th}$ pattern layer P1_1 included in another pattern portion PP of the same coil. Therefore, the pattern portions PP disposed in the folding portion 630 of a coil may be disposed between the holes HL.

According to an embodiment, portions of different coils RFL1, RFL2, RFL3, RFL4, RFL5 and RFL6 may be disposed between the holes adjacent to each other in the first direction DR1 among the holes HL included in the same group holes.

For example, a portion (e.g., the second pattern layer P2) of the second coil RFL2, a portion (e.g., the third pattern layer P3) of the third coil RFL3, a portion (e.g., the third pattern layer P3) of the fourth coil RFL4 and a portion (e.g., the second pattern layer P2) of the fifth coil RFL5 may be disposed between the $(1-1)^{th}$ hole HL1_1 and the $(1-2)^{th}$ hole HL1_2 of the first group hole HL1.

For example, portions (e.g., pattern portions PP) of the coils RFL1, RFL2, RFL3, RFL4, RFL5 and RFL6 forming four different loops may be disposed between the holes adjacent to each other in the first direction DR1 among the holes HL included in the same group holes.

For example, portions of the coils RFL1, RFL2, RFL3, RFL4, RFL5 and RFL6 forming different loops may be disposed between the $(2-1)^{th}$ hole HL2_1 and the $(2-2)^{th}$ hole HL2_2 of the second group hole HL2 or between the $(2-2)^{th}$ hole HL2_2 and the $(2-3)^{th}$ hole HL2_3 of the second group hole HL2.

According to an embodiment, a first line width of each of the coils RFL1, RFL2, RFL3, RFL4, RFL5 and RFL6 disposed in the first non-folding portion (see '610' in FIG. 8) and the second non-folding portion (see '620' in FIG. 8) may be greater than a second line width of each of the pattern portions PP of the coils RFL1, RFL2, RFL3, RFL4, RFL5 and RFL6 disposed in the folding portion (see '630' in FIG. 8).

For example, the first line width may be in a range of about 200 μm to about 400 μm, and the second line width may be in a range of about 30 μm to about 60 μm, but the first line width and the second line width are not limited thereto.

Figure 11:
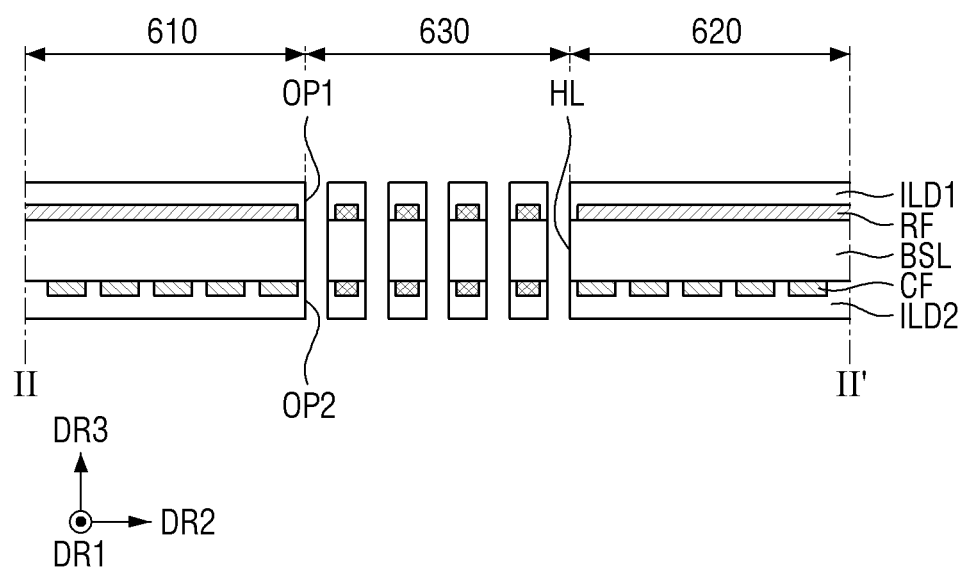
FIG. 11 is a schematic cross-sectional view taken along line II-IF of FIG. 10.
Figure 12:
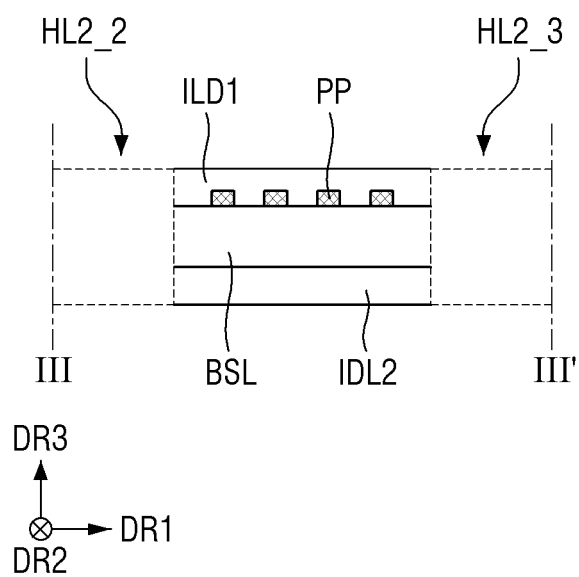
FIG. 12 is a schematic cross-sectional view taken along line of FIG. 10.

FIG. 11 is a schematic cross-sectional view taken along line II-IF of FIG. 10. FIG. 12 is a schematic cross-sectional view taken along line III-III' of FIG. 10.

Referring to FIGS. 11 and 12, the digitizer 600 according to an embodiment may include a base layer BSL, first sensing coils RF and second sensing coils CF, which are disposed on the base layer BSL, and a first insulating layer ILD1 and a second insulating layer ILD2, which cover the first and second sensing coils RF and CF disposed on the base layer BSL.

The holes HL defined (or formed) in the folding portion 630 of the digitizer 600 may be formed by penetrating from the front surface to the rear surface of the base layer BSL.

The first sensing coil RF may be disposed on the front surface of the base layer BSL, and the second sensing coil CF may be disposed on the rear surface of the base layer BSL. For example, the first and second sensing coils RF and CF may overlap each other in the third direction DR3, which is a thickness direction, with the base layer BSL interposed therebetween.

For example, the first sensing coils RF disposed in the first non-folding portion 610 and the second non-folding portion 620 may extend along the second direction DR2 in a line shape on a cross-section, and the first sensing coils RF disposed in the folding portion 630 may be spaced apart from each other along the second direction DR2 in an island shape on a cross-section. The first sensing coils RF disposed in the folding portion 630 may be the pattern portions PP of the coils RFL1, RFL2, RFL3, RFL4, RFL5 and RFL6 described with reference to FIG. 10.

The second sensing coils CF disposed in the first non-folding portion 610, the second non-folding portion 620 and the folding portion 630 may be spaced apart from each other along the second direction DR2 in an island shape on a cross-section.

As shown in FIG. 12, the pattern portions PP disposed between the $(2-2)^{th}$ hole HL2_2 and the $(2-3)^{th}$ hole HL2_3, which are included in the same hole group, may be portions of the coils RFL1, RFL2, RFL3, RFL4, RFL5 and RFL6 forming different loops described with reference to FIG. 10. For example, the pattern portions PP shown in FIG. 12 may be any one of the first pattern layers (see 'P1_1 and P1_2' in FIG. 10), the second pattern layer (see 'P2' in FIG. 10) and the third pattern layer (see 'P3' in FIG. 10), which are included in the pattern portions PP of the coils RFL1, RFL2, RFL3, RFL4, RFL5 and RFL6.

The first insulating layer ILD1 may be disposed on the front surface of the digitizer 600 to cover the first sensing coils RF. First openings OP1 corresponding to the holes HL may be defined (or formed) in the first insulating layer ILD1.

The second insulating layer ILD2 may be disposed on the rear surface of the digitizer 600 to cover the second sensing coils CF. Second openings OP2 corresponding to the holes HL may be defined (or formed) in the second insulating layer ILD2.

As the first openings OP1, the holes HL and the second openings OP2 are formed by the same process, the corresponding first openings OP1, holes HL and second openings OP2 may be aligned along the third direction DR3.

In an embodiment, the first insulating layer ILD1 and the second insulating layer ILD2 may have a certain color. For example, the first insulating layer ILD1 and the second insulating layer ILD2 may have a black color. The first insulating layer ILD1 and the second insulating layer ILD2 may be made by coating an insulating material including a dye and/or a pigment on the base layer BSL. Each of the first insulating layer ILD1 and the second insulating layer ILD2 may include an inorganic layer or an organic layer of a single layer or a multi-layer.

Figure 13:
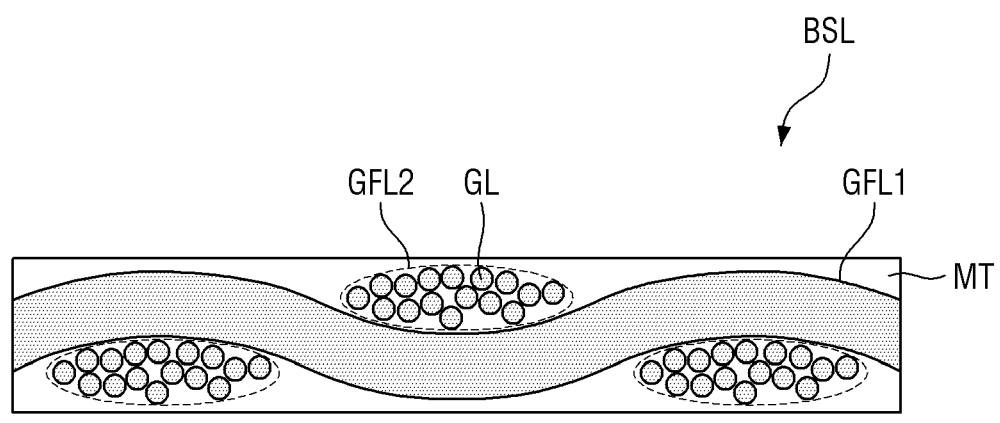
FIG. 13 is a schematic cross-sectional view illustrating a base layer of a digitizer according to an embodiment.
Figure 13:
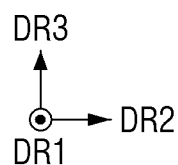
Figure 14:
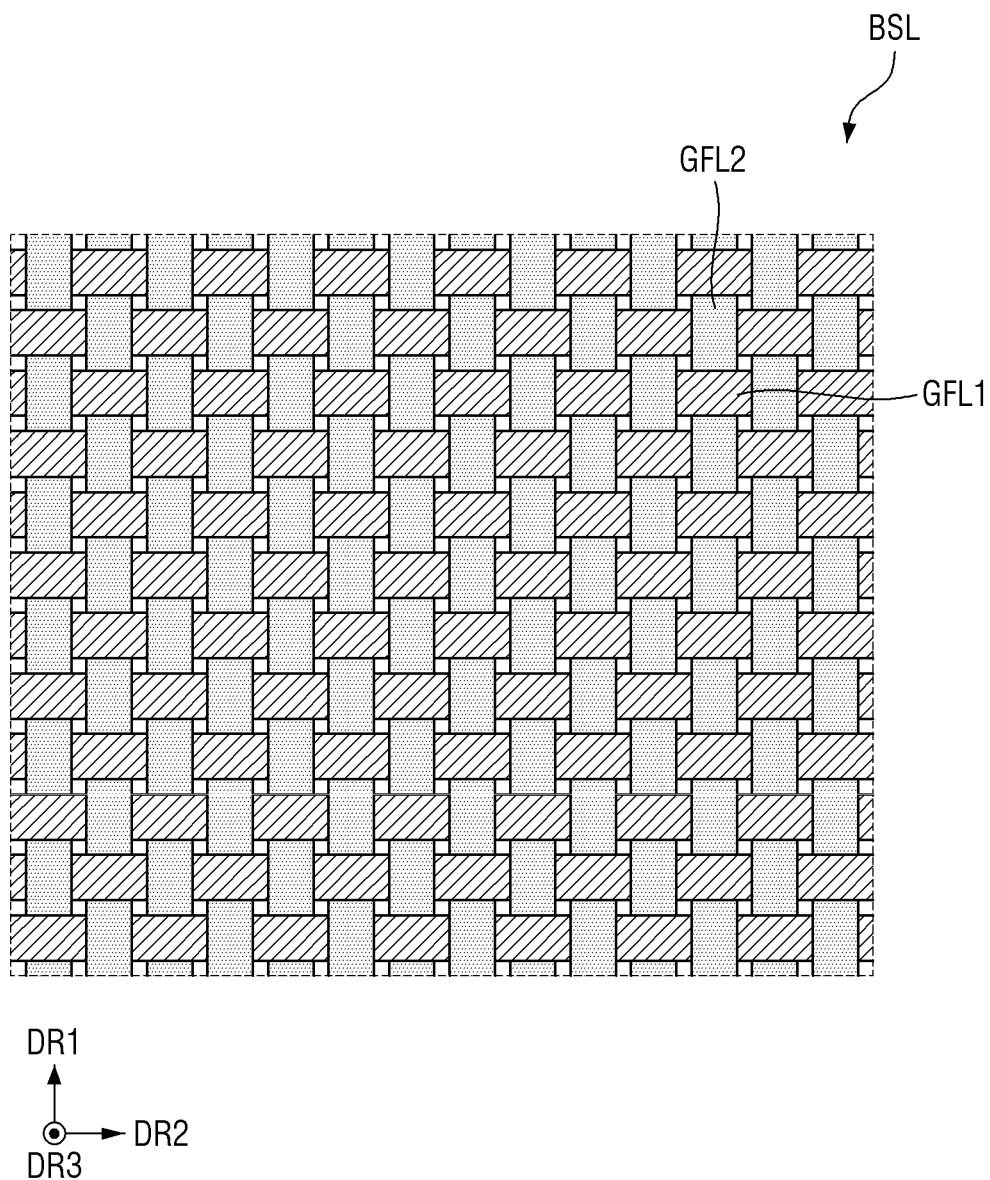
FIG. 14 is a schematic plan view illustrating a base layer of a digitizer according to an embodiment.

FIG. 13 is a schematic cross-sectional view illustrating a base layer of a digitizer according to an embodiment. FIG. 14 is a schematic plan view illustrating a base layer of a digitizer according to an embodiment.

Referring to FIGS. 13 and 14, the base layer BSL according to an embodiment may include a matrix MT including a filler and an elastomer, and weaving-shaped fiber lines GFL1 and GFL2 disposed inside the matrix MT. The fiber lines GFL1 and GFL2 may be glass fiber-reinforced plastics (GFRP).

Each of the fiber lines GFL1 and GFL2 may be provided in the form of a bundle in which glass fibers GL are gathered. A diameter of the glass fiber GL of a strand included in a fiber line may be in a range of about 3 μm to about 10 μm. However, the diameter of the glass fiber GL is not limited to the above range thereof.

The fiber lines GFL1 and GFL2 may be alternately arranged along the first direction DR1 and the second direction DR2 so as to have a fabric shape on a plane.

The fiber lines GFL1 and GFL2 may be disposed inside the matrix MT. The matrix MT according to an embodiment may include at least one of epoxy, polyester, polyamides, polycarbonates, polypropylene, polybutylene, or vinyl ester.

The matrix MT may include a filler. The filler may include at least one of silica, barium sulfate, sintered talc, barium titanate, titanium oxide, clay, alumina, mica, boehmite, zinc borate or zinc tin oxide.

The matrix MT may also include an elastomer. The elastomer may be a polymer material having rubber elasticity. For example, the elastomer may include at least one of butadiene rubber, styrene-butadiene rubber, isoprene rubber, styrene-isoprene rubber, polyester rubber, polybutadiene, hydrogenated polybutadiene, nitrile-butadiene rubber, acryl rubber or silicon rubber.

In an embodiment, the base layer BSL of the digitizer 600 may have a storage modulus value of about 5 MPa to about 50 Mpa. However, the storage modulus value of the base layer BSL is not limited to the illustrated range thereof.

In case that the storage modulus of the base layer BSL is greater than or substantially equal to about 5 MPa, impact resistance of the folding portion 630 of the digitizer 600 may be improved, and in case that the storage modulus of the base layer BSL is substantially equal to or less than about 500 MPa, flexibility of the folding portion 630 of the digitizer 600 may be maintained during the folding state of the display device 10, so that crack may be prevented from occurring in the folding portion 630 of the digitizer 600.

The digitizer 600 according to FIGS. 1 to 14 may include holes HL in the folding portion 630, and the shape of the digitizer 600 may be readily modified during the folding operation of the display device 10 as the width of the folding portion 630, the widths WD1 and WD2 of the holes HL, the spaced distances DS1 and DS2 between the holes HL and the spaced distance DS3 between the coils may be designed in the above-described ranges thereof. As the digitizer 600 includes the pattern portions PP of the coils disposed between the holes HL of the folding portion 630, the digitizer 600 that is integrally formed may be provided.

For example, the base layer BSL of the digitizer 600 may include a fiber bundle of glass fiber-reinforced plastic disposed inside the matrix MT to protect the lower portion of the display panel 100 during the folding state, and the matrix MT of the base layer BSL may include an elastomer, which is a polymer material having elasticity, to prevent crack from occurring in the folding portion 630 of the digitizer 600 due to an external force during the folding operation of the display device 10.

Therefore, the digitizer 600 may function as a protective member and at the same time function as a sensing member. Therefore, a separate metal plate for protecting the display panel 100 may be omitted, and a digitizer separately disposed in the folding portion 630 may be omitted. As a result, the display device 10, which is slim and manufactured at low cost, may be provided.

Hereinafter, an embodiment of the display device will be described. In the following embodiment, the same reference numerals will be given to the same elements as those of the previously described embodiment, and redundant descriptions will be omitted or simplified and the following description will be based on differences for descriptive convenience.

Figure 15:
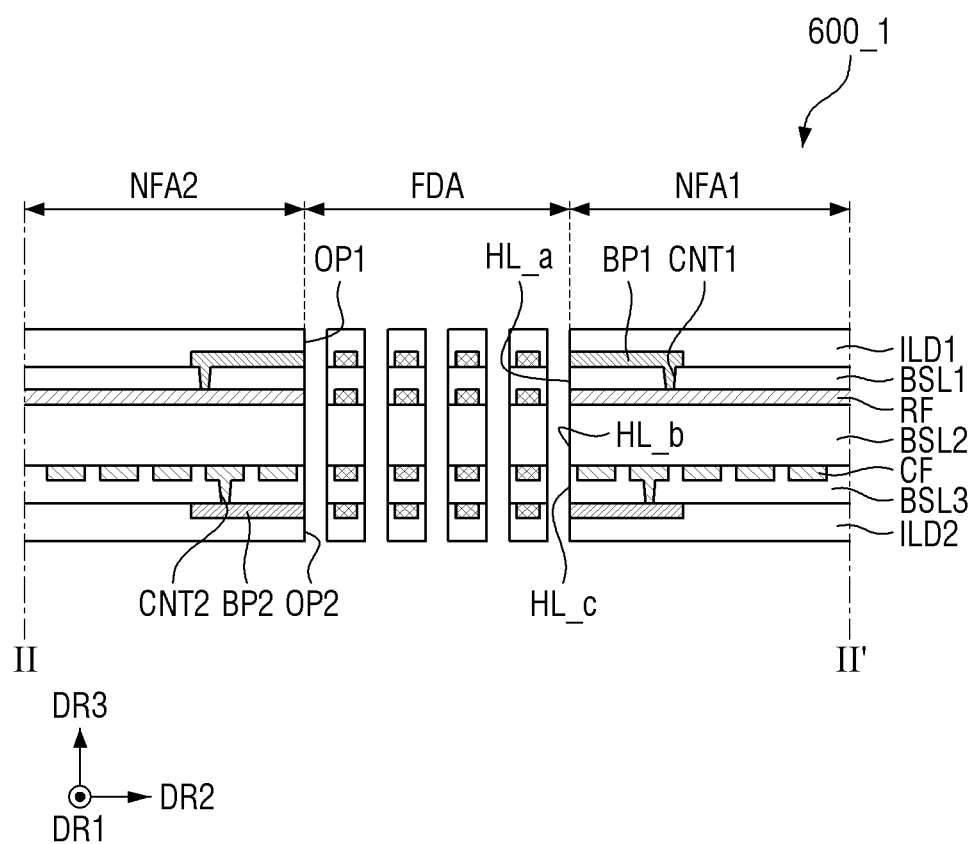
FIG. 15 is a schematic cross-sectional view illustrating a digitizer according to an embodiment.

FIG. 15 is a schematic cross-sectional view illustrating a digitizer according to an embodiment.

Compared with the embodiment shown in FIG. 11, a digitizer 600_1 according to the embodiment shown in FIG. 15 may include base layers BSL1, BSL2 and BSL3, first sensing coils RF, second sensing coils CF, a first insulating layer ILD1, and a second insulating layer ILD2. The digitizer 600_1 may further include bridge lines BP1 and BP2.

The base layers BSL1, BSL2 and BSL3 may be an upper layer BSL1, an intermediate layer BSL2, and a lower layer BSL3, respectively. Each of the base layers BSL1, BSL2 and BSL3 may include the matrix MT and the fiber lines GFL1 and GFL2 disposed inside the matrix MT as described in FIGS. 13 and 14, and may include the same material as that of the matrix MT described above. For example, the matrix MT according to the embodiment may include the filler and the elastomer, which are described with reference to FIGS. 13 and 14.

First sensing coils RF and second sensing coils CF may be disposed on front and rear surfaces of the intermediate layer BSL2, respectively. Intermediate holes HL_b may be formed in the intermediate layer BSL2.

The upper layer BSL1 may be disposed on the front surface of the intermediate layer BSL2 to cover the first sensing coils RF. The first bridge line BP1 may be disposed on the upper layer BSL1, and may be covered by the first insulating layer ILD1. Upper holes HL_a may be defined (or formed) in the upper layer BSL1.

The first bridge line BP1 may be connected (e.g., electrically connected) to the first sensing coils RF through a first bridge contact hole CNT1 defined (or formed) in the upper layer BSL1.

The lower layer BSL3 may be disposed on the rear surface of the intermediate layer BSL2 to cover the second sense coils CF. The second bridge line BP2 may be disposed on the lower layer BSL3, and may be covered by the second insulating layer ILD2. Lower holes HL_c may be defined (or formed) in the lower layer BSL3.

The holes HL_a, HL_b and HL_c may be formed by the same process and thus may be aligned with one another along the third direction DR3.

The second bridge line BP2 may be connected (e.g., electrically connected) to the second sensing coils CF through a second bridge contact hole CNT2 defined (or formed) in the lower layer BSL3.

The first bridge line BP1 and the second bridge line BP2 may be disposed in a line shape extending along the second direction DR2 on the cross-section in the first non-folding area NFA1 and the second non-folding area NFA2, respectively, and may be disposed in an island shape by being spaced apart from each other along the second direction DR2 on the cross-section in the folding area FDA.

In the digitizer 600_1 of FIG. 15, in case that the lines disposed between the holes adjacent to each other in the first direction DR1 among the holes disposed in the same group hole described with reference to FIG. 10 are five or more, any pattern layer may be disposed in the upper layer BSL1 or the lower layer BSL3 and connected (e.g., electrically connected) to the sensing coils RF and CF through the bridge lines BP1 and BP2.

Therefore, the number of sensing coils disposed between the holes included in the digitizer 600_1 may be increased to enhance a density of the sensing coils RF and CF disposed between the holes, whereby the digitizer 600_1 having improved sensing performance may be provided.

Hereinafter, a method of manufacturing a display device will be described with reference to FIGS. 16 to 20.

FIGS. 16 to 20 are schematic cross-sectional views illustrating a method of manufacturing a digitizer according to an embodiment. FIGS. 16 to 20 are schematic cross-sectional views illustrating a method of manufacturing the digitizer 600 described with reference to FIGS. 11 and 12. The same/similar reference numerals will be given to the same/similar elements as those described above, and redundant descriptions will be omitted for descriptive convenience.

Figure 16:
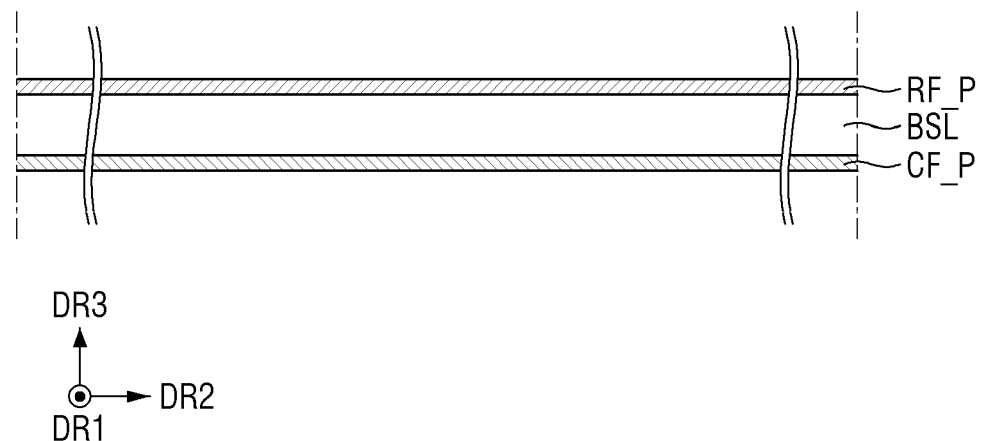
FIGS. 16 to 20 are schematic cross-sectional views illustrating a method of manufacturing a digitizer according to an embodiment.

Referring to FIG. 16, the method of manufacturing the digitizer 600 according to an embodiment may include forming a first conductive layer RF_P on a front surface of a base layer BSL and forming a second conductive layer CF_P on a rear surface of the base layer BSL. The first conductive layer RF_P and the second conductive layer CF_P may include copper, but embodiments are not limited thereto. For example, the first conductive layer RF_P and the second conductive layer CF_P may include a material other than copper. Further, the base layer BSL may include the filler and the elastomer, which are described above.

Figure 17:
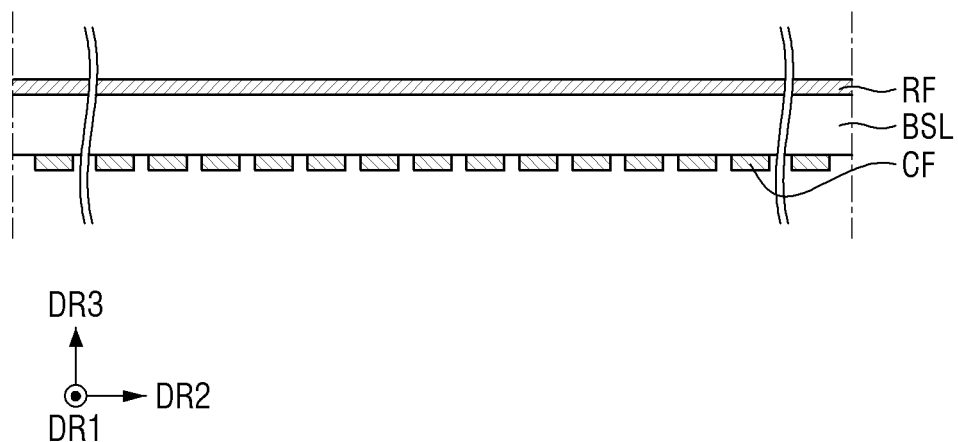

Afterwards, referring to FIG. 17, the method may include patterning the first conductive layer RF_P and the second conductive layer CF_P.

For example, the first conductive layer RF_P may be patterned to form first sensing coils RF, and the second conductive layer CF_P may be patterned to form second sensing coils CF. The first sensing coils RF and the second sensing coils CF may correspond to the arrangement and shape of the first sensing coils RF and the second sensing coils CF, which are described with reference to FIGS. 8 to 10.

Figure 18:
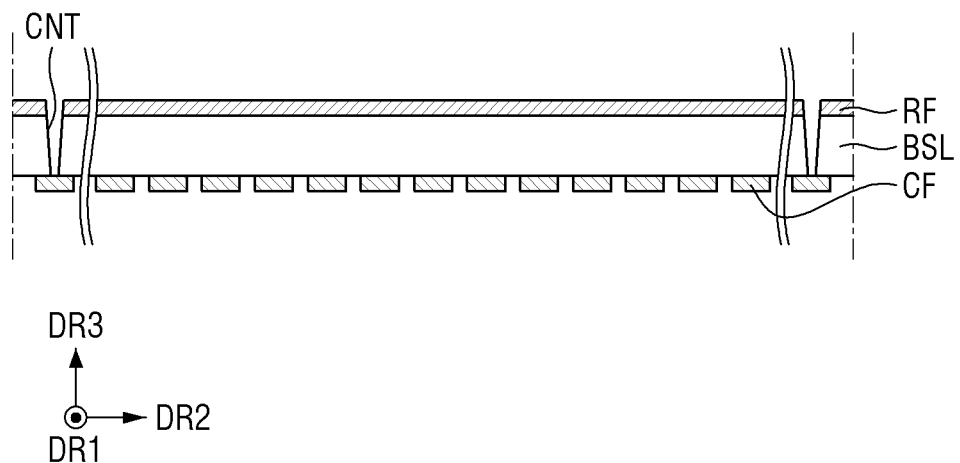

Afterwards, referring to FIG. 18, the method may include forming a contact hole CNT in the base layer BSL.

For example, the contact hole CNT may be formed by passing through the front surface and the rear surface of the base layer BSL. For example, the contact hole CNT may be formed by passing through the base layer BSL from the front surface to the rear surface of the base layer BSL. In this process, a portion of the first sensing coil RF positioned on the area where the contact hole CNT is formed may be removed together with the base layer BSL.

For example, the contact hole CNT may be disposed in a peripheral area (see 'NAA' in FIG. 8) of the digitizer (see '600' in FIG. 8). Although FIG. 18 illustrates that the contact hole CNT is positioned at a side and another side in the second direction DR2, the number and position of the contact holes CNT are not limited thereto.

Figure 19:
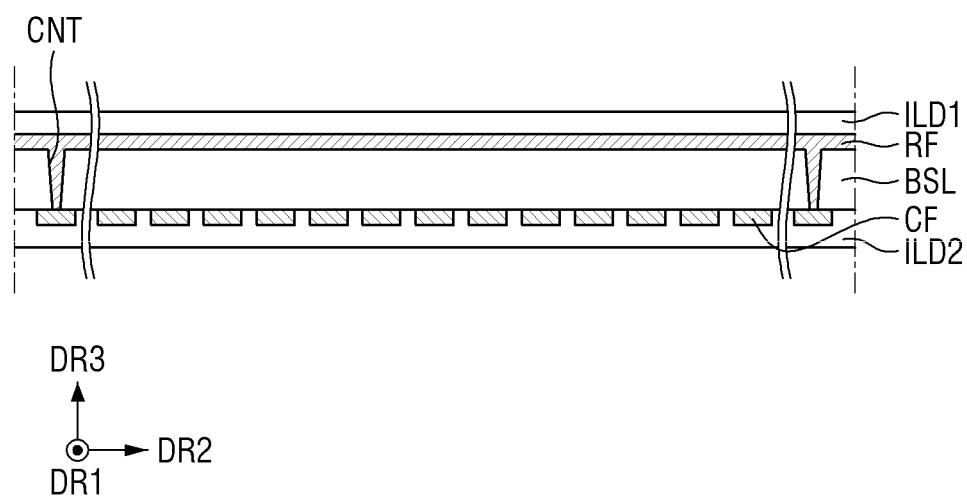

Afterwards, referring to FIG. 19, the method may include plating (or coating) the first sensing coils RF.

For example, as the first sensing coils RF are plated (or coated), the inside of the contact hole CNT may be filled with a metal material. Therefore, a portion of the coils disposed on the front surface of the base layer BSL among the coils connected (e.g., electrically connected) with the first sensing coil RF cut in the process of forming the contact hole CNT and disposed in the peripheral area (see 'NAA' in FIG. 8) may be connected (e.g., electrically connected) to the coil disposed on the rear surface of the base layer BSL.

For example, the first sensing coil RF disposed on the front surface of the base layer BSL and the second sensing coil CF disposed on the rear surface of the base layer BSL may be connected (e.g., electrically connected) to each other through the contact hole CNT.

For another example, the connection between the first sensing coils RF through the contact hole CNT may be a connection relation between the first long sides RFL1_1 and the second long sides RFL1_2 and the short side RSL, which are described with reference to FIG. 8. For example, the short side RSL may be disposed on the rear surface of the base layer BSL, and may be connected (e.g., electrically connected) to an end portion of each of the first long sides RFL1_1 and the second long sides RFL1_2 through the contact hole CNT.

Afterwards, the method may include forming a first insulating layer ILD1 and a second insulating layer ILD2 on the base layer BSL.

For example, the first insulating layer ILD1 may be disposed on the front surface of the base layer BSL, and may cover the first sensing coils RF. The second insulating layer ILD2 may be disposed on the rear surface of the base layer BSL and may cover the second sensing coils CF.

The first insulating layer ILD1 and the second insulating layer ILD2 may have a black color. This may be made by coating an insulating material including a dye and/or a pigment on the base layer BSL.

Figure 20:
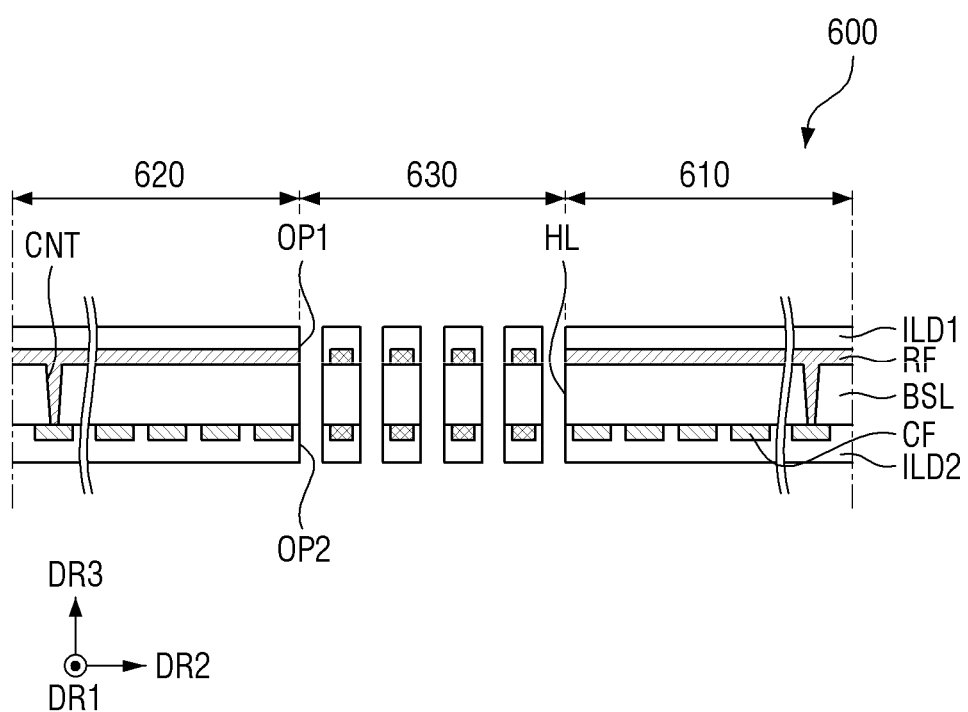

Afterwards, referring to FIG. 20, the method may include forming holes HL passing through the base layer BSL.

For example, as the first insulating layer ILD1 and the second insulating layer ILD2 are simultaneously removed in the process of forming the holes HL, openings OP1 and OP2 corresponding to the holes HL may be formed in the insulating layers ILD1 and ILD2. Therefore, the openings OP1 and OP2 corresponding to the holes HL may be aligned in the third direction DR3.

In the method of manufacturing the digitizer 600 according to an embodiment, the digitizer 600 may include a folding portion 630 in which holes HL are formed, and first and second non-folding portions 610 and 620 spaced apart from each other with the folding portion 630 interposed therebetween.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device comprising:
    a display panel including a first non-folding area, a second non-folding area, and a folding area that are arranged along a first direction, the folding area being foldable along a folding line extending along a second direction intersecting the first direction;
    a panel lower member disposed below the display panel; and
    a digitizer disposed below the panel lower member and including a base layer and sensing coils, wherein
    the base layer includes a folding portion including holes overlapping the folding area of the display panel, and first and second non-folding portions disposed along the first direction, the folding portion disposed between the first and second non-folding portions,
    the sensing coils are disposed on the base layer, and
    the base layer includes:
        a matrix including a filler and an elastomer, and
        weaving-shaped fiber lines disposed inside the matrix and alternately arranged with each other.

2. The display device of claim 1, wherein,
    a first width of each of the holes in the first direction is in a range of about 0.1 mm to about 0.5 mm, and a second width of each of the holes in the second direction is in a range of about 4 mm to about 10 mm.

3. The display device of claim 1, wherein,
a first spaced distance between adjacent holes in the first direction among the holes is in a range of about 0.1 mm to about 0.3 mm, and
a second spaced distance between adjacent holes in the second direction among the holes is in a range of about 0.1 mm to about 0.5 mm.

4. The display device of claim 1, wherein a width of the folding portion in the first direction is in a range of about 5 mm to about 20 mm.

5. The display device of claim 1, wherein a portion of each of different sensing coils is disposed between adjacent holes among the holes.

6. The display device of claim 1, wherein the sensing coils include:
first sensing coils including:
first long sides extending along the first direction in the first non-folding portion and the second non-folding portion, and
first short sides extending along the second direction and connected to an end portion of each of the first long sides, and second sensing coils including:
second long sides insulated from the first sensing coils and extending along the second direction in the first non-folding portion and the second non-folding portion, and
second short sides extending along the first direction and connected to an end portion of each of the second long sides.

7. The display device of claim 6, wherein a spaced distance in the second direction between the first long sides facing each other, among the first long sides of the first sensing coils partially disposed between adjacent holes is substantially equal to or less than a half of a sum of a width of each of the holes in the first direction and a spaced distance between the adjacent holes in the second direction among the holes.

8. The display device of claim 1, wherein
each of the holes includes a first group hole and a second group hole that extend in the second direction and spaced apart from each other along the second direction, and
the second group hole is shifted in the second direction by a certain distance from the first group hole.

9. The display device of claim 1, wherein
the matrix includes at least one of epoxy, polyester, polyamide, polycarbonate, polypropylene, polybutylene or vinyl ester, and
the filler includes at least one of silica, barium sulfate, sintered talc, barium titanate, titanium oxide, clay, alumina, mica, boehmite, zinc borate or zinc tin oxide.

10. The display device of claim 9, wherein the elastomer includes at least one of butadiene rubber, styrene-butadiene rubber, isoprene rubber, styrene-isoprene rubber, polyester rubber, polybutadiene, hydrogenated polybutadiene, nitrile-butadiene rubber, acryl rubber or silicone rubber.

11. The display device of claim 1, wherein the base layer includes a plurality of layers stacked along a thickness direction of the display panel.

12. The display device of claim 11, wherein
the base layer includes:
an intermediate layer on which the sensing coils are disposed,
an upper layer disposed on the intermediate layer, and
a lower layer disposed below the intermediate layer, and
the digitizer further includes a bridge line disposed on at least one of the upper layer and the lower layer, and
the bridge line is connected to the sensing coils by passing through at least one of the upper layer and the lower layer.

13. The display device of claim 1, wherein a storage modulus of the base layer is in a range of about 5 MPa to about 50 MPa.

14. The display device of claim 1, further comprising:
insulating layers disposed on front and rear surfaces of the base layer to cover the sensing coils, the insulating layers including openings overlapping the holes.

15. The display device of claim 14, wherein the insulating layers include at least one of a pigment or a dye in a black color.

16. The display device of claim 1, wherein a thickness of the digitizer is in a range of about 30 μm to about 300 μm.

17. A digitizer comprising:
a base layer including a folding portion having holes, and first and second non-folding portions spaced apart from each other along a first direction, the folding portion disposed between the first and second non-folding portions;
sensing coils disposed on the base layer; and
insulating layers disposed on front and rear surfaces of the base layer to cover the sensing coils, the insulating layers including openings overlapping the holes, wherein
a portion of each of the sensing coils that are different from each other is disposed between adjacent holes among the holes, and
the base layer includes:
a matrix including a filler and an elastomer, and
weaving-shaped fiber lines disposed inside the matrix and alternately arranged with each other.

18. The digitizer of claim 17, wherein the sensing coils include:
first sensing coils including:
first long sides extending along the first direction in the first non-folding portion and the second non-folding portion, and
first short sides extending along a second direction intersecting the first direction and connected to an end portion of each of the first long sides, and second sensing coils including:
second long sides insulated from the first sensing coils, extending along the second direction in the first non-folding portion and the second non-folding portion, and
second short sides extending along the first direction and connected to an end portion of each of the second long sides.

19. The digitizer of claim 18, wherein each of the first sensing coils overlapping the folding portion includes:
first pattern layers extending in the second direction and spaced apart from each other by the holes disposed between the first pattern layers,
a second pattern layer connecting end portions of the first pattern layers, and
third pattern layers connected to other end portions opposite to the end portions of the first pattern layers.

20. The digitizer of claim 17, wherein the elastomer includes at least one of butadiene rubber, styrene-butadiene rubber, isoprene rubber, styrene-isoprene rubber, polyester rubber, polybutadiene, hydrogenated polybutadiene, nitrile-butadiene rubber, acryl rubber or silicone rubber.

\* \* \* \* \*